US 12,457,857 B2

(12) United States Patent
Won et al.

(10) Patent No.: US 12,457,857 B2
(45) Date of Patent: Oct. 28, 2025

(54) DISPLAY DEVICE WITH DIFFERENT INTERVALS BETWEEN THE EDGE OF THE CONVEX SURFACE AND THE EDGE OF THE EMISSION AREA

(71) Applicant: SAMSUNG DISPLAY CO., LTD., Yongin-si (KR)

(72) Inventors: Byeong Hee Won, Incheon (KR); Young Chan Kim, Incheon (KR); Ju Hwa Ha, Seoul (KR); Jong Ho Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 514 days.

(21) Appl. No.: 17/932,032

(22) Filed: Sep. 14, 2022

(65) Prior Publication Data

US 2023/0200141 A1    Jun. 22, 2023

(30) Foreign Application Priority Data

Dec. 20, 2021 (KR) .................. 10-2021-0182617

(51) Int. Cl.
*H10K 59/122* (2023.01)
*G02B 27/01* (2006.01)
*H10K 50/858* (2023.01)

(52) U.S. Cl.
CPC ....... *H10K 59/122* (2023.02); *G02B 27/0172* (2013.01); *H10K 50/858* (2023.02); *G02B 2027/0178* (2013.01)

(58) Field of Classification Search
CPC .. H10K 59/122; H10K 50/858; H10K 50/841; H10K 50/856; H10K 59/00; H10K 59/35; G02B 27/0172; G02B 2027/0178
See application file for complete search history.

(56) References Cited

U.S. PATENT DOCUMENTS 9,627,654 B2    4/2017    Shim et al.
9,853,093 B2   12/2017    Shim et al.
(Continued)

FOREIGN PATENT DOCUMENTS

CN    112054131    12/2020
JP    2021-015732    2/2021
(Continued)

OTHER PUBLICATIONS

Korean Office Action Cited in Korean Application No. 10-2021-0182617, Dated Jul. 16, 2025.

*Primary Examiner* — William B Partridge
*Assistant Examiner* — David Paul Sedorook
(74) *Attorney, Agent, or Firm* — F. CHAU & ASSOCIATES, LLC

(57) ABSTRACT

A display device includes a substrate including pixels, a pixel defining film on the substrate and defining an emission area, an emission layer in the emission area, a first refraction film on the pixel defining film and the emission layer and having a first refractive index, and a second refraction film covering the first refraction film and having a second refractive index. The second refraction film includes a convex surface convexly protruding from a reference surface and overlapping the emission area. Each of the emission area and the convex surface includes first and second edges. The edges of the convex surface are positioned outside the edges of the emission area, and a first interval between the first edges of the convex surface and the emission area is greater than a second interval between the second edges of the convex surface and the emission area.

20 Claims, 21 Drawing Sheets

(56) References Cited

U.S. PATENT DOCUMENTS

| | | |
|---|---|---|
| 10,790,474 B2 | 9/2020 | Lee et al. |
| 11,258,050 B2 | 2/2022 | Lee et al. |
| 2010/0259766 A1* | 10/2010 | Wiese .................. H01L 25/167 |
| | | 219/121.72 |
| 2015/0084026 A1* | 3/2015 | Miyamoto ........... H10K 50/858 |
| | | 257/40 |
| 2016/0109752 A1* | 4/2016 | Tateno ................. G02B 3/0068 |
| | | 349/110 |
| 2019/0081119 A1* | 3/2019 | Choi ...................... H10K 59/35 |
| 2019/0221779 A1* | 7/2019 | Jang ..................... H10K 59/122 |
| 2020/0006439 A1* | 1/2020 | Sun ........................ H10K 50/11 |
| 2020/0089002 A1* | 3/2020 | Lee ........................... G02B 5/30 |
| 2020/0295308 A1* | 9/2020 | Baek ................. G02B 27/0172 |
| 2021/0013453 A1* | 1/2021 | Matsuda ............. H10K 50/858 |
| 2022/0115629 A1* | 4/2022 | Suzuki ............. G02B 19/0014 |

FOREIGN PATENT DOCUMENTS

| | | |
|---|---|---|
| KR | 10-0229618 | 11/1999 |
| KR | 10-2016-0034458 A | 3/2016 |
| KR | 10-1634353 | 6/2016 |
| KR | 10-2020-0028257 A | 3/2020 |
| KR | 10-2020-0081627 | 7/2020 |
| KR | 10-2021-0098446 A | 8/2021 |

* cited by examiner

EMA_G: EMA_G1, EMA_G2

EMA_G: EMA_G1, EMA_G2

EMA_G: EMA_G1, EMA_G2

DISPLAY DEVICE WITH DIFFERENT INTERVALS BETWEEN THE EDGE OF THE CONVEX SURFACE AND THE EDGE OF THE EMISSION AREA

CROSS-REFERENCE TO RELATED APPLICATION

This application claims priority under 35 U.S.C. § 119 to Korean Patent Application No. 10-2021-0182617, filed on Dec. 20, 2021 in the Korean Intellectual Property Office, the disclosure of which is incorporated by reference herein in its entirety.

TECHNICAL FIELD

Embodiments of the disclosure relate to a display device.

DISCUSSION OF RELATED ART

Wearable electronic devices including display devices may be directly worn on a user's body, thus, improving portability and accessibility. An example of a wearable device is a see-through head mounted display (head mounted electronic device), which can be mounted on a wearer's head to provide virtual reality (VR).

A display device includes a light-receiving type display device such as, for example, a liquid crystal display device, a field emission display device, and a light emitting display device, and a light emitting element such as, for example, an organic light emitting display device including an organic light emitting element, an inorganic light emitting display device including an inorganic light emitting element such as an inorganic semiconductor, and a micro light emitting display device including a micro light emitting element.

SUMMARY

Aspects of the disclosure provide a display device capable of increasing luminance at a specific viewing angle by refracting a direction of light emitted from the display device.

According to an embodiment of the disclosure, a display device includes a substrate including a plurality of pixels arranged along a first direction and a second direction, a pixel defining film disposed on the substrate, disposed along a boundary of the pixel, and defining an emission area, an emission layer disposed in the emission area defined by the pixel defining film, a first refraction film disposed on the pixel defining film and the emission layer and having a first refractive index, and a second refraction film covering the first refraction film and having a second refractive index different from the first refractive index. The second refraction film includes a reference surface and a convex surface convexly protruding from the reference surface, the convex surface overlaps the emission area, each of the emission area and the convex surface includes a first edge and a second edge extending in a first diagonal direction crossing the first direction and the second direction, the first edge and the second edge of the convex surface are positioned outside the first edge and the second edge of the emission area, respectively, and a first interval between the first edge of the convex surface and the first edge of the emission area is greater than a second interval between the second edge of the convex surface and the second edge of the emission area.

The first refraction film and the second refraction film may be in contact with each other, and have complementary shapes in a contact surface therebetween.

The convex surface may have an island shape in a plan view.

The first interval may be greater than the second interval by about 1/5 to about 1/2 of a width of the convex surface in the first diagonal direction.

A thickness of the convex surface from the reference surface may be within a range of about 1/8 to about 1/6 of a width of the convex surface in the first diagonal direction.

Each of the emission area and the convex surface may further include a third edge and a fourth edge extending in a second diagonal direction crossing the first direction, the second direction, and the first diagonal direction, the third edge and the fourth edge of the convex surface are positioned outside the third edge and the fourth edge of the emission area, respectively, and a third interval between the third edge of the convex surface and the third edge of the emission area is the same as a fourth interval between the fourth edge of the convex surface and the fourth edge of the emission area.

The third interval and the fourth interval may be smaller than the first interval by about 1/10 to about 1/4 of a width of the convex surface in the first diagonal direction.

The second refractive index may be greater than the first refractive index.

The convex surface may convexly protrude from the reference surface toward the first refraction film.

The second refractive index may be in a range of about 1.73 to about 1.8, and the first refractive index may be in a range of about 1.46 to about 1.48.

The convex surface may convexly protrude from the reference plane in an opposite direction to the first refraction film, and the second refractive index may be smaller than the first refractive index.

The convex surface may extend in a second diagonal direction, and overlaps the emission area of each of the plurality of pixels arranged along the second diagonal direction.

The convex surface may further extend in the first diagonal direction, and the emission area of each of the plurality of pixels is further arranged along the first diagonal direction.

The display device further includes a third refraction film disposed between the pixel defining film and the emission layer and having a third refractive index, and a fourth refraction film disposed on the third refraction film and having a fourth refractive index different from the third refractive index.

The fourth refraction film may include at least one protrusion part disposed in a thickness direction so as to overlap the emission area.

The fourth refractive index may be greater than the third refractive index.

Each of the emission area and the convex surface may further include a third edge and a fourth edge extending in a second diagonal direction crossing the first direction, the second direction, and the first diagonal direction, the third edge and the fourth edge of the convex surface are positioned outside the third edge and the fourth edge of the emission area, respectively, and a third interval between the third edge of the convex surface and the third edge of the emission area is the same as a fourth interval between the fourth edge of the convex surface and the fourth edge of the emission area.

According to an embodiment of the disclosure, a display device includes a substrate including a plurality of pixels arranged along a first direction and a second direction, a pixel defining film disposed on the substrate, disposed along a boundary of the pixel, and defining an emission area, an emission layer disposed in the emission area defined by the pixel defining film, a first refraction film disposed on the pixel defining film and the emission layer; and a second refraction film covering the first refraction film. The second refraction film includes a reference surface and a convex surface convexly protruding from the reference surface, the convex surface overlaps the emission area, the substrate includes a first area positioned on one side of a first virtual line in the first direction and a second area positioned on the other side of the first virtual line in the first direction, and the first virtual line extends in the second direction while passing through one point of the substrate. In the first area, each of the emission area and the convex surface includes a first edge and a second edge extending in a first diagonal direction crossing the first direction and the second direction, the first edge and the second edge of the convex surface are positioned outside the first edge and the second edge of the emission area, respectively, and a first interval between the first edge of the convex surface and the first edge of the emission area is greater than a second interval between the second edge of the convex surface and the second edge of the emission area. In the second area, each of the emission area and the convex surface includes a third edge and a fourth edge extending in a second diagonal direction crossing the first direction, the second direction, and the first diagonal direction, the third edge and the fourth edge of the convex surface are positioned outside the third edge and the fourth edge of the emission area, respectively, and a third interval between the third edge of the convex surface and the third edge of the emission area is greater than a fourth interval between the fourth edge of the convex surface and the fourth edge of the emission area.

The first area and the second area may be positioned on one side of a second virtual line in the second direction, the second virtual line extending in the first direction while passing through one point of the substrate, and the substrate further includes a third area positioned on the other side of the second virtual line in the second direction and positioned on one side of the first virtual line in the first direction and a fourth area positioned on the other side of the second virtual line in the second direction and positioned on the other side of the first virtual line in the first direction. In the third area, each of the emission area and the convex surface includes a third edge and a fourth edge extending in the second diagonal direction, the third edge and the fourth edge of the convex surface are positioned outside the third edge and the fourth edge of the emission area, respectively, and a third interval between the third edge of the convex surface and the third edge of the emission area is greater than a fourth interval between the fourth edge of the convex surface and the fourth edge of the emission area. In the fourth area, each of the emission area and the convex surface includes a first edge and a second edge extending in the second diagonal direction crossing the first direction, the second direction, and the first diagonal direction, the first edge and the second edge of the convex surface are positioned outside the first edge and the second edge of the emission area, respectively, and a first interval between the first edge of the convex surface and the first edge of the emission area is greater than a second interval between the second edge of the convex surface and the second edge of the emission area.

The one point may be positioned at a center of the substrate.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
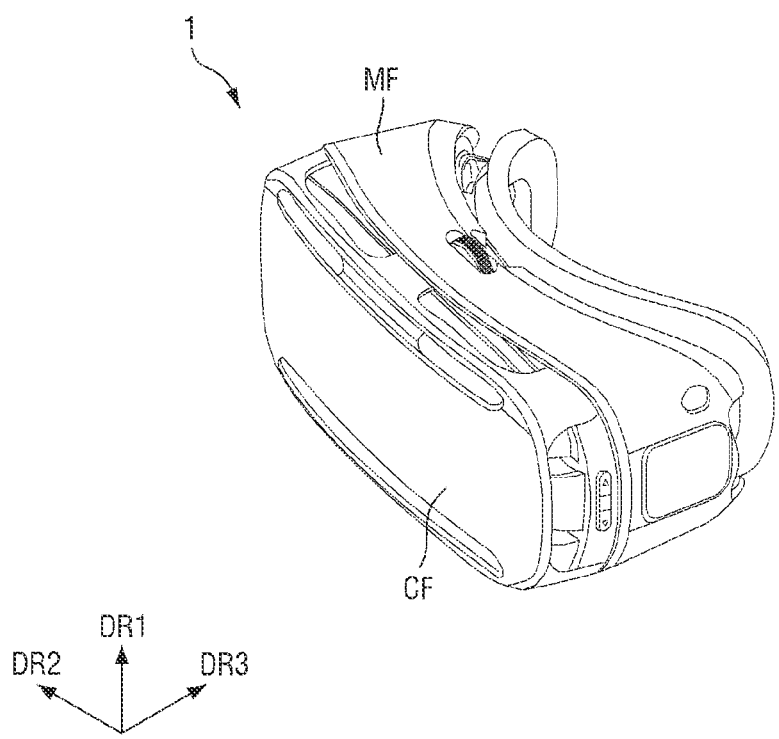
FIG. 1 is a perspective view of a display device according to an embodiment.

Embodiments of the disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

The terms of a singular form may include plural forms unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

Figure 2:
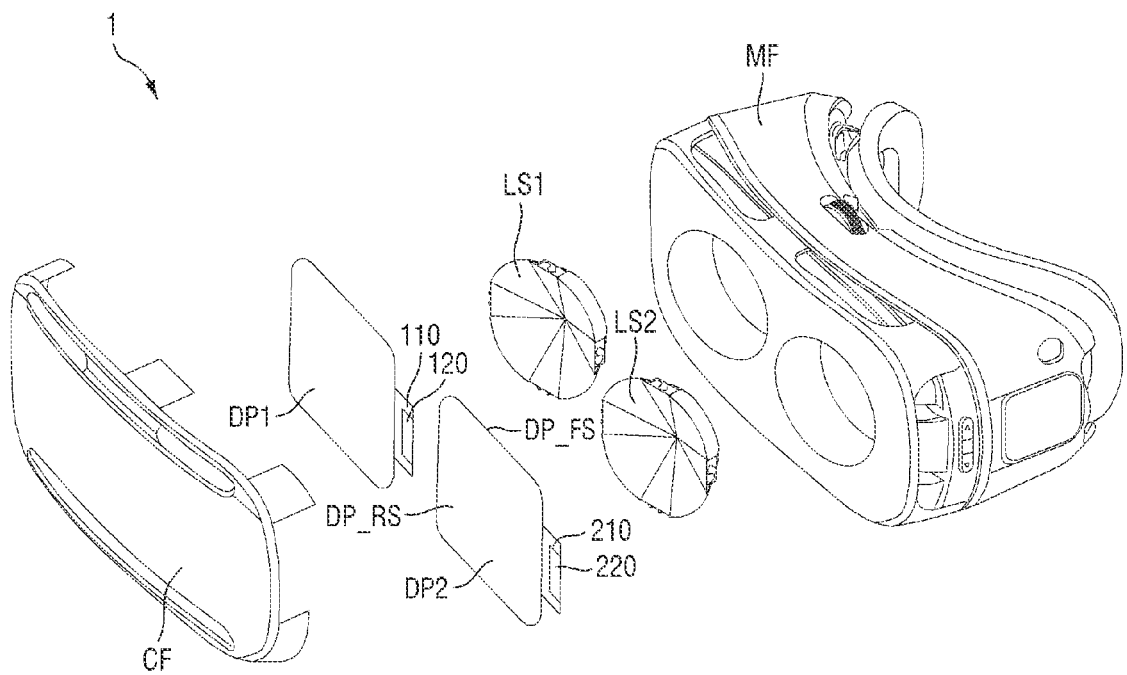
FIG. 2 is an exploded perspective view of the display device according to an embodiment.

FIG. 1 is a perspective view of a display device according to an embodiment. FIG. 2 is an exploded perspective view of the display device according to an embodiment.

Referring to FIGS. 1 and 2, a display device 1 includes a main frame MF, a display panel DP, a multi-channel lens LS, and a cover frame CF.

In the drawings, a first direction DR1 is a direction substantially parallel to one side of the display device 1 in a plan view, and refers to a longitudinal direction of the display device 1. A second direction DR2 is a direction substantially parallel to the other side in contact with one side of the display device 1 in a plan view, and refers to a transverse direction of the display device 1. Hereinafter, one side in the first direction DR1 refers to an upward direction in a plan view, the other side in the first direction DR1 refers to a downward direction in a plan view, one side in the second direction DR2 refers to a rightward direction in a plan view, and the other side in the second direction DR2 refers to a leftward direction in a plan view.

A third direction DR3 is a direction crossing a plane on which the first direction DR1 and the second direction DR2 are placed, and refers to a direction substantially perpendicularly crossing both the first direction DR1 and the second direction DR2. However, it is to be understood that directions described herein refer to relative directions, and embodiments are not limited thereto.

Unless otherwise defined, the terms "upper portion", "upper surface", and "upper side" expressed with respect to the third direction DR3 herein refer to a front surface DP_FS of the display panel DP with respect to the display device 1, and the terms "lower portion", "lower surface", and "lower side" refer to a rear surface DP_RS of the display panel DP, which is an opposite side to the front surface DP_FS of the display panel DP with respect to the display device 1.

The main frame MF may be configured to be worn on a user's face. The main frame MF may have a shape corresponding to a shape of a user's head (face). The main frame MF may be mounted with a first lens LS1, a second lens LS2, the display panel DP: DP1 and DP2, and the cover frame CF. The main frame MF may include a space or structure in which the display panel DP and the multi-channel lens LS may be accommodated. In some embodiments, the main frame MF may further include a structure such as a strap or a band for easy mounting, and the main frame MF may be further mounted with a controller, an image processing unit, a lens accommodating unit, etc.

The display panel DP may display images. The display panel DP may include a first display panel DP1 and a second display panel DP2. The first display panel DP1 and the second display panel DP2 may be arranged along the second direction DR2. The first display panel DP1 and the second display panel DP2 may be fixedly installed on the main frame MF in a state in which they are spaced apart from each other.

The first display panel DP1 and the second display panel DP2 may include front surfaces DP_FS of the display panel DP on which the images are displayed, and rear surfaces DP_RS of the display panel DP opposite to the front surfaces DP_FS of the display panel DP. Light for providing the images may be emitted from the front surfaces DP_FS of the first display panel DP1 and the second display panel DP2.

The first display panel DP1 provides the image to a user's right eye, and the second display panel DP2 provides the image to a user's left eye. Each of the first display panel DP1 and the second display panel DP2 may be, for example, an organic light emitting display panel that uses organic light emitting elements, a micro light emitting diode display panel that uses micro light emitting diodes (LEDs), a quantum dot light emitting display panel that includes quantum dot light emitting diodes, a liquid crystal on silicon substrate (LCoS), an organic light emitting device on silicon substrate (OLEDoS), or a light emitting diode on silicon substrate (LEDoS). Hereinafter, it will be primarily described that each of the first display panel DP1 and the second display panel DP2 is an organic light emitting display panel. However, each of the first display panel DP1 and the second display panel DP2 is not limited thereto.

Each of the first display panel DP1 and the second display panel DP2 includes a plurality of sub-pixels disposed on a substrate. Data lines and scan lines are disposed on the substrate so as to cross each other, and the plurality of sub-pixels are disposed in a matrix form by a crossing structure between the data lines and the scan lines. Each of the plurality of sub-pixels may be connected to at least one data line and at least one scan line. Therefore, each of the plurality of pixels receives a data voltage applied from the data line when a scan signal is applied to the scan line, and emits light according to the applied data voltage. The first display panel DP1 and the second display panel DP2 will be described in detail below with reference to FIGS. 7 to 9.

In an embodiment, the first display panel DP1 and the second display panel DP2 may be attachable to and detachable from the main frame MF. The first display panel DP1 and the second display panel DP2 may be, before example, opaque, transparent, or translucent depending on a type of the display device 1.

The first circuit board 110 may be attached to pads provided on an edge of one side of the first display panel DP1. In addition, a second circuit board 210 may be attached to pads provided on an edge of one side of the second display panel DP2. Each of the first circuit board 110 and the second circuit board 210 may be a flexible printed circuit board or a chip on film.

A first display driver 120 may be mounted on the first circuit board 110. The first display driver 120 receives digital video data and timing signals from the controller, applies data voltages to data lines of the first display panel DP1 according to the timing signals, and supplies scan driving signals for driving a scan driver supplying scan signals to scan lines of the first display panel DP1 to the scan driver.

A second display driver 220 may be mounted on the second circuit board 210. The second display driver 220 receives digital video data and timing signals from the controller, applies data voltages to data lines of the second display panel DP2 according to the timing signals, and supplies scan driving signals for driving a scan driver supplying scan signals to scan lines of the second display panel DP2 to the scan driver.

The first display driver 120 and the second display driver 220 may be formed as integrated circuits.

The multi-channel lens LS may be disposed on the front surface DP_FS of the display panel DP. The multi-channel lens LS may pass the light emitted from the first display panel DP1 and the second display panel DP2 therethrough and provide the light to a user. The multi-channel lens LS may provide a plurality of channels passing the light emitted from the first display panel DP1 and the second display panel DP2 therethrough. The plurality of channels may pass the light emitted from the first display panel DP1 and the light emitted from the second display panel DP2 through different paths and provide light from each channel to the user. The light emitted from the first display panel DP1 and the light emitted from the second display panel DP2 may be incident on the respective channels, such that an enlarged image may be focused on the user's eyes.

The multi-channel lens LS may include a first lens LS1 and a second lens LS2.

The first lens LS1 and the second lens LS2 may pass each of the light emitted from the first display panel DP1 and the light emitted from the second display panel DP2 therethrough and provide each light to the user. The first lens LS1 and the second lens LS2 may be disposed on the front surfaces DP_FS of the first display panel DP1 and the second display panel DP2, respectively. The first lens LS1 and the second lens LS2 may be arranged on the front surfaces DP_FS of the first display panel DP1 and the second display panel DP2, respectively, so as to correspond to positions of the user's left and right eyes, respectively. The first lens LS1 and the second lens LS2 may be accommodated in the main frame MF.

The first lens LS1 and the second lens LS2 reflect and/or refract light for providing images each displayed on the first display panel DP1 and the second display panel DP2, and provide the reflected and/or refracted light to the user.

The cover frame CF may be disposed on the rear surfaces DP_RS of the first display panel DP1 and the second display panel DP2 to protect the first display panel DP1 and the second display panel DP2.

In some embodiments, the display device 1 may further include a controller controlling an overall operation of the display device 1.

The controller controls various functions of the display device 1. For example, the controller may output first image data to the first display driver 120 of the first circuit board 110 so that the first display panel DP1 displays an image. In addition, the controller may output second image data to the second display driver 220 of the second circuit board 210 so that the second display panel DP2 displays an image.

The controller may control the first display panel DP1 and the second display panel DP2 to display the same image. Alternatively, the controller may control the first display panel DP1 to display a right eye image optimized for the user's right eye and control the second display panel DP2 to display a left eye image optimized for the user's left eye. In addition, the controller may control the first display panel DP1 to display a right eye stereoscopic image and control the second display panel DP2 to display a left eye stereoscopic image, to implement a stereoscopic image.

The controller may be implemented as, for example, an application processor formed of an integrated circuit, a central processing unit, or a general-purpose processor including a system chip etc., but is not limited thereto.

Figure 3:
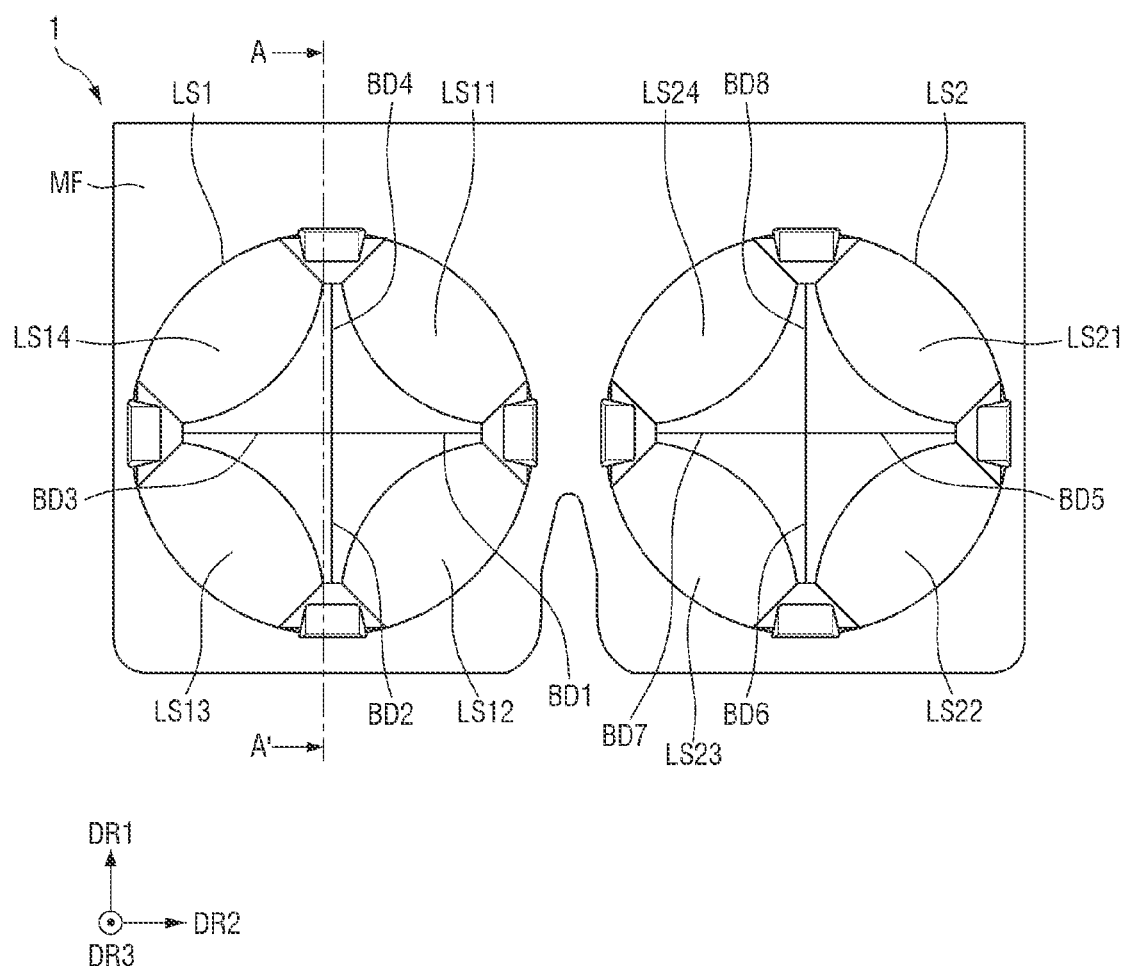
FIG. 3 is a plan view of a plurality of lenses according to an embodiment.
Figure 4:
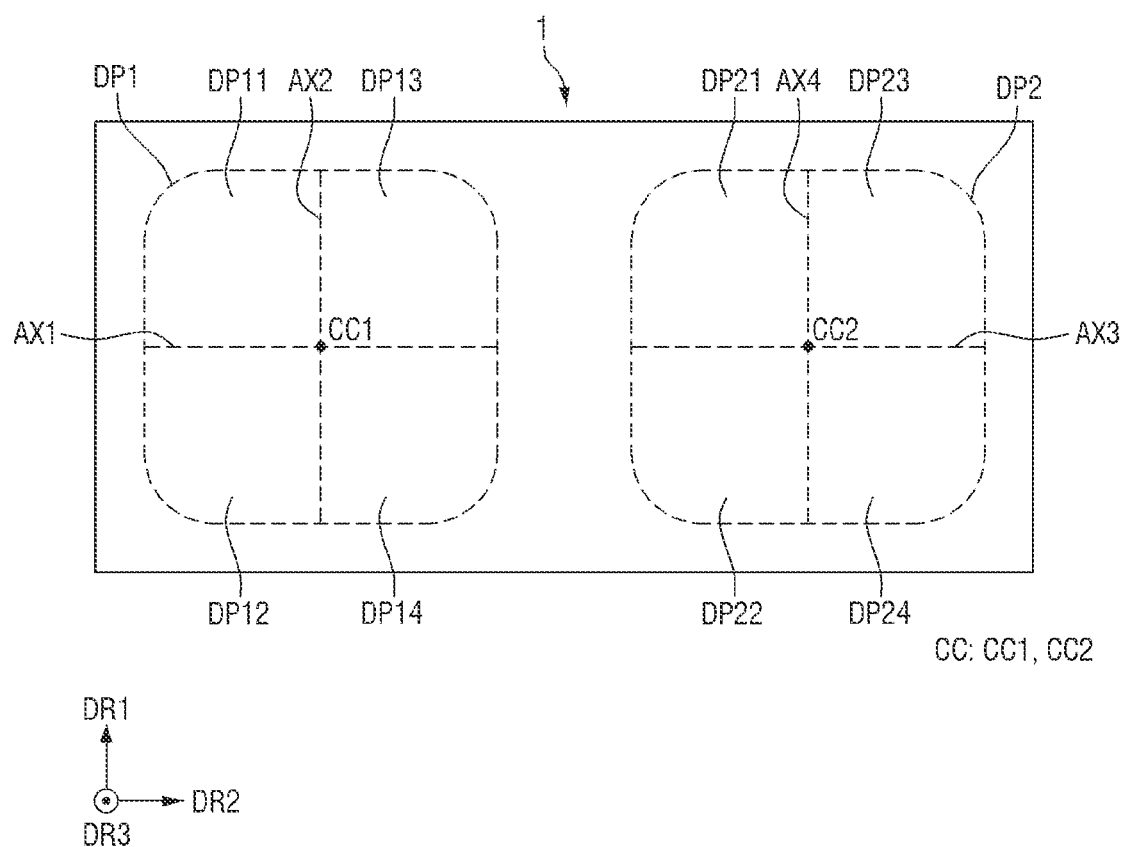
FIG. 4 is a plan view of a display unit according to an embodiment.
Figure 5:
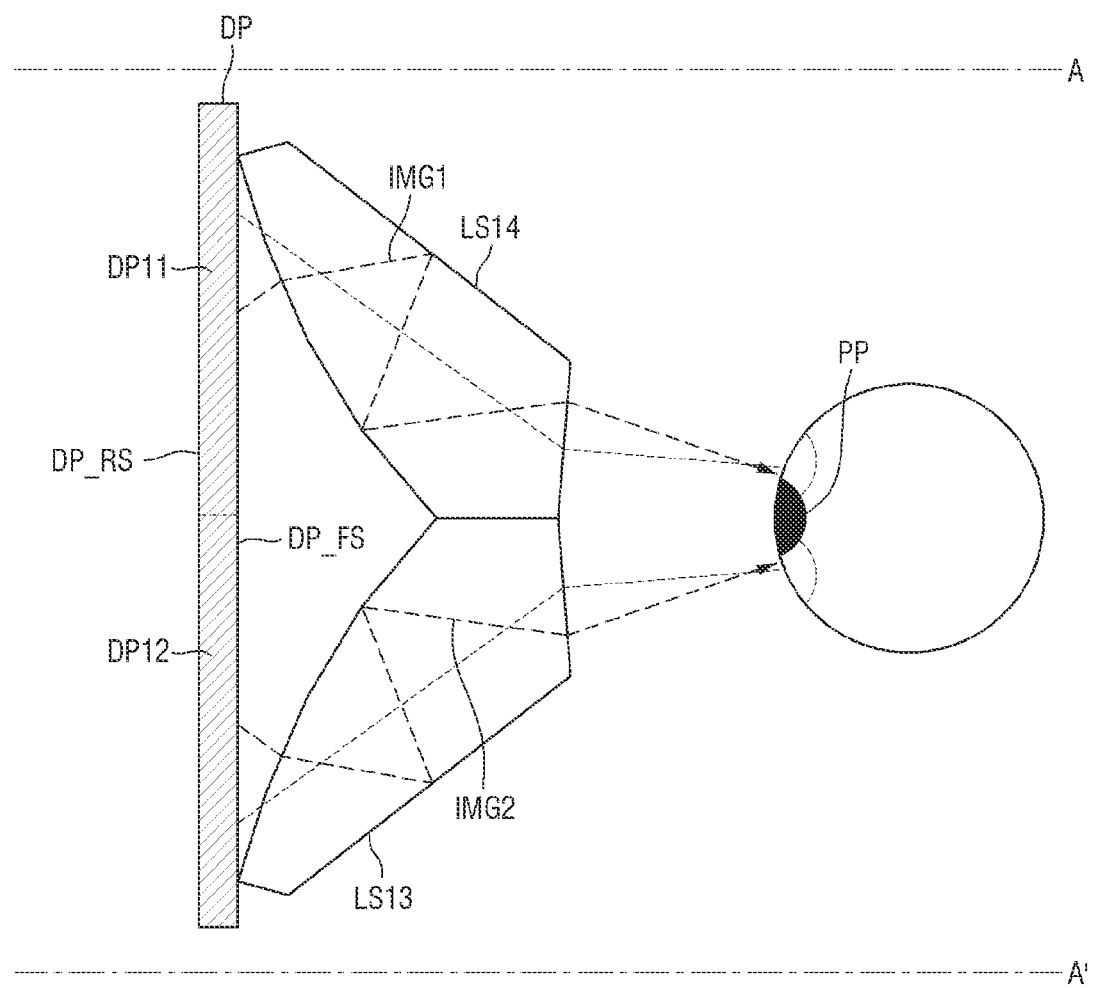
FIG. 5 is a cross-sectional view taken along line A-A' of FIG. 3 according to an embodiment.

FIG. 3 is a plan view of a plurality of lenses according to an embodiment. FIG. 4 is a plan view of a display unit according to an embodiment. FIG. 5 is a cross-sectional view taken along line A-A' of FIG. 3 according to an embodiment.

Referring to FIG. 3, the first lens LS1 and the second lens LS2 may be disposed on the front surfaces DP_FS of the first display panel DP1 and the second display panel DP2, respectively, and may be positioned at positions corresponding to both eyes of the user, respectively. For example, the first lens LS1 and the second lens LS2 may be symmetrical to each other in the second direction with respect to the center of the display device 1, and the first lens LS1 and the second lens LS2 may have substantially the same or similar structures. For example, each of the first display panel DP1 and the second display panel DP2 may be disposed in a rectangular shape with rounded corners in the second direction DR2 (horizontal direction in FIG. 3), which is a left and right direction, in a plan view, the first lens LS1 may be positioned on the left side in the second direction DR2 on the front surface DP_FS of the first display panel DP1, and the second lens LS2 may be positioned on the right side in the second direction DR2 on the front surface DP_FS of the second display panel DP2.

The first lens LS1 and the second lens LS2 may include a plurality of sub-lenses L11, L12, L13, and L14 and a plurality of sub-lenses L21, L22, L23, and L24, respectively. For example, the first lens LS1 may include a first sub-lens L11, a second sub-lens L12, a third sub-lens L13, and a fourth sub-lens L14. The second lens LS2 may include a fifth sub-lens L21, a sixth sub-lens L22, a seventh sub-lens L23, and an eighth sub-lens L24. However, the number of the plurality of sub-lenses L11, L12, L13, L14, L21, L22, L23, and L24 is not limited thereto.

The second lens LS2 is substantially the same as or similar to the first lens LS1, and thus, the first lens LS1 will hereinafter be primarily described, and a repeated description of the second lens LS2 will be omitted.

Referring to FIG. 3, the first lens LS1 may have an approximately circular shape in a plan view. For example, the first sub-lens L11, the second sub-lens L12, the third sub-lens L13, and the fourth sub-lens L14 may be disposed in a clover shape so as to surround the center of the circular shape in a plan view. As illustrated in FIG. 3, the first sub-lens L11, the second sub-lens L12, the third sub-lens L13, and the fourth sub-lens L14 may be disposed on the upper right side, the lower right side, the upper left side, and the lower left side with respect to the center of the first lens LS1, respectively. The first sub-lens L11, the second sub-lens L12, the third sub-lens L13, and the fourth sub-lens L14 may be integrally connected to each other or be separated from each other.

Referring to FIG. 4, each of the first display panel DP1 and the second display panel DP2 may have an approximately rectangular shape with rounded corners on a plane defined by the first direction DR1 and the second direction DR2. For example, each of the first display panel DP1 and the second display panel DP2 may be disposed in a rectangular shape with rounded corners in the third direction DR2 (horizontal direction in FIG. 4), which is a left and right direction, on the plane defined by the first direction DR1 and the second direction DR2.

As illustrated in FIG. 4, in an embodiment, a plurality of areas for displaying an image may be defined in the first display panel DP1 so as to correspond to the respective sub-lenses L11, L12, L13, and L14. The plurality of areas may be disposed on a plane defined by the first direction DR1 and the second direction DR2 of the first display panel DP1. A first origin CC1 of the first display panel DP1 may overlap the center of the first lens LS1 and/or the center of the first display panel DP1, and a second origin CC2 of the second display panel DP2 may overlap the center of the second lens LS2 and/or the center of the second display panel DP2.

The plurality of areas are defined by a first axis AX1 extending in one direction with respect to the first origin CC1 and a second axis AX2 crossing the first axis AX1. The first display panel DP1 may include a first area DP11, a second area DP12, a third area DP13, and a fourth area DP14 having the first axis AX1 and the second axis AX2 as boundaries with respect to the first origin CC1. The first area DP11, the second area DP12, the third area DP13, and the fourth area DP14 may be disposed to surround the center of a rectangle with rounded corners on a plane defined by the first direction DR1 and the second direction DR2, respectively. For example, as illustrated in FIG. 4, the first area DP11, the second area DP12, the third area DP13, and the fourth area DP14 may be disposed on the upper left side, the lower left side, the upper right side, and the lower right side with respect to the first origin CC1 of the first display panel DP1, respectively. The first area DP11, the second area DP12, the third area DP13, and the fourth area DP14 may be separated from each other or be integrally connected to each other. Each area of the first display panel DP1 will be described below with reference to FIGS. 6 to 9.

The first display panel DP1 may include a fifth area DP21, a sixth area DP22, and a seventh area DP23, and an eighth area DP24 having a third axis AX3 and a fourth axis AX4 as boundaries with respect to the second origin CC2. The fifth area DP21 to the eighth area DP24 of the second display panel DP2 are substantially the same as or similar to the first area DP11 to the fourth area DP14 of the first display panel DP1, and a description thereof will thus be omitted for convenience of description.

Referring to FIGS. 3 to 5, the light emitted from the front surfaces DP_FS of the first display panel DP1 and the second display panel DP2 may be provided to user's pupils PP through the plurality of channels of the plurality of sub-lenses L11, L12, L13, L14, L21, L22, L23, and L24. Light emitted from different areas of the front surfaces DP_FS of the first display panel DP1 and the second display panel DP2 may pass through the respective channels through different paths. The light of the first display panel DP1 and the light of the second display panel DP2 may include partial images for configuring one complete virtual reality (VR) image, respectively.

For example, as illustrated in FIG. 5, the fourth sub-lens L14 may provide a channel through which light IMG1 emitted from the first area DP11 of the first display panel DP1 passes, and the third sub-lens L13 may provide a channel through which light IMG2 emitted from the second area DP12 of the first display panel DP1 passes. The first area DP11 and the second area DP12 of the first display panel DP1 may include an area overlapping the fourth sub-lens L14 and an area overlapping the third sub-lens L13, respectively.

Similarly, in some embodiments, the first sub-lens L11 and the second sub-lens L12 may provide channels through which light emitted from the third area DP13 of the first display panel DP1 and light emitted from the fourth area DP14 of the first display panel DP1 pass, respectively.

The light of the first display panel DP1 and the light of the second display panel DP2 passing through the respective sub-lenses L11, L12, L13, L14, L21, L22, L23, and L24 may be refracted twice and reflected twice and then provided to the user's pupils PP, but the numbers of times of the refraction and the reflection are not limited. However, in a case of the light of the first display panel DP1 and the light of the second display panel DP2 passing through the respective sub-lenses L11, L12, L13, L14, L21, L22, L23, and L24, the respective sub-lenses L11, L12, L13, L14, L21, L22, L23, and L24 may refract and reflect light emitted between about 10° and about 50° with respect to a virtual line substantially perpendicular to an emission surface of an organic emission layer OEL among light emitted to a front surface and side surfaces of the organic emission layer OEL, and provide the refracted and reflected light to the user's pupils PP.

Figure 6:
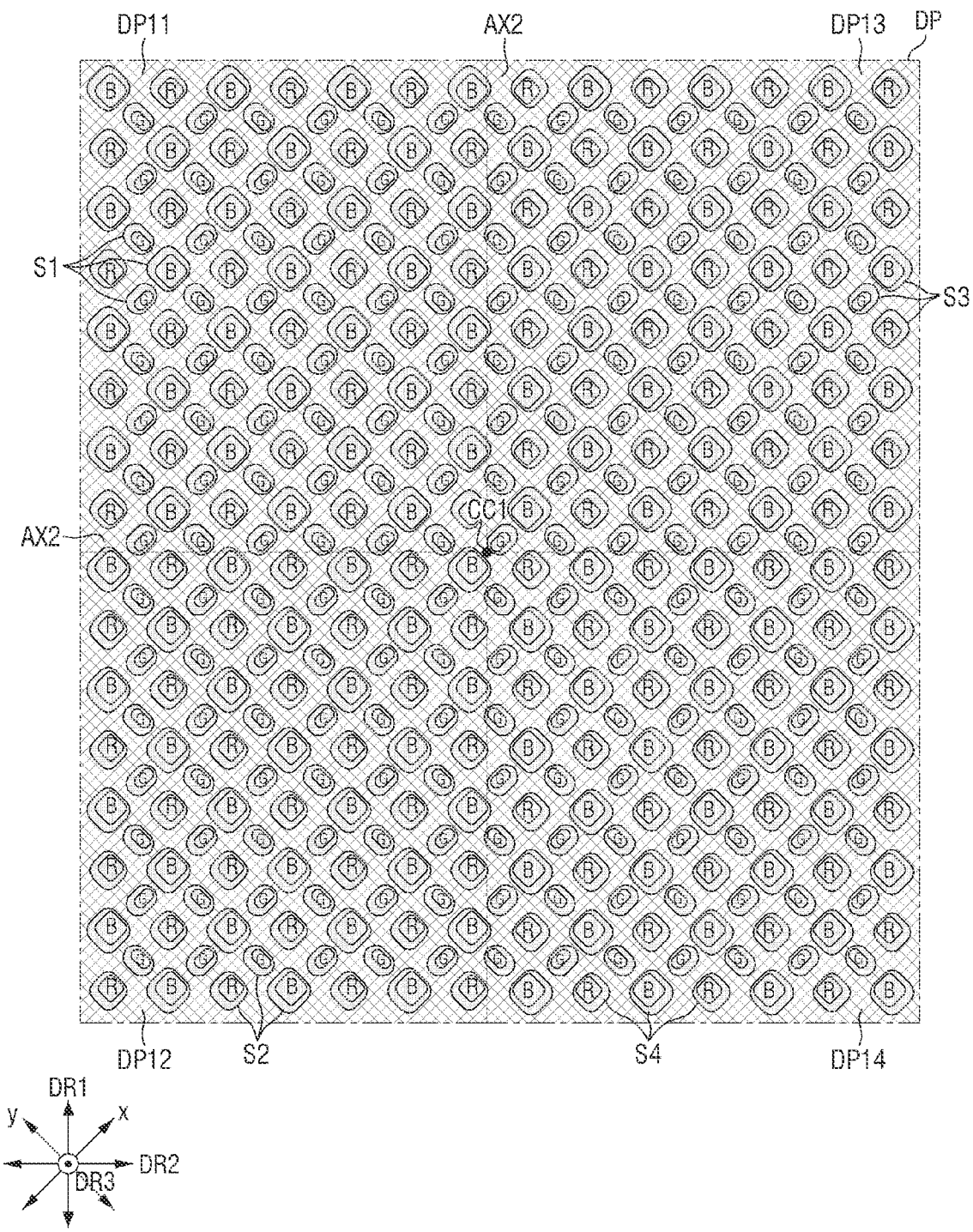
FIG. 6 is a layout view illustrating a plurality of areas of a first display panel according to an embodiment.
Figure 7:
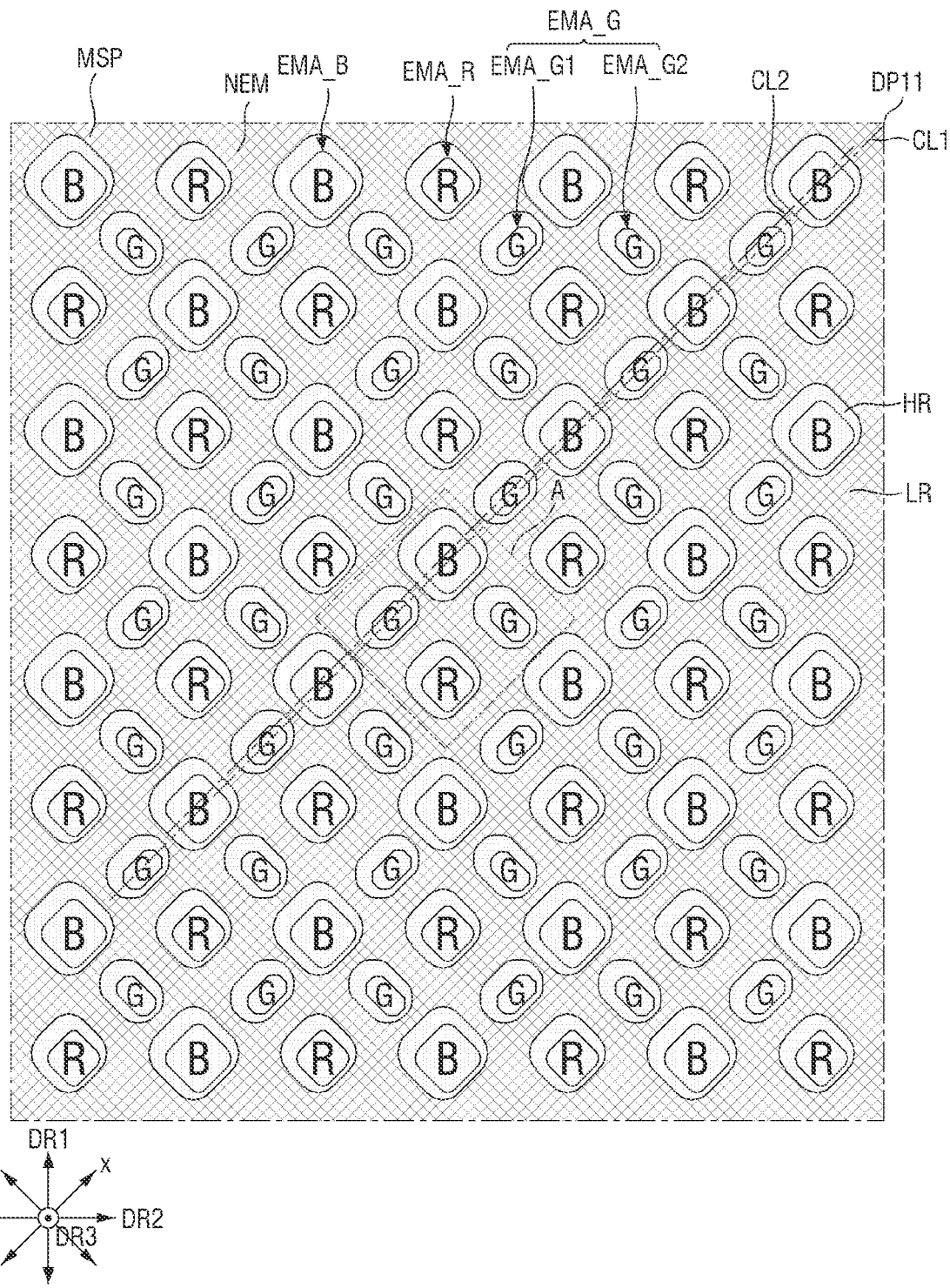
FIG. 7 is a layout view illustrating a relative arrangement relationship of pixels of a display panel according to an embodiment.

FIG. 6 is a layout view illustrating a plurality of areas of a first display panel according to an embodiment. FIG. 7 is a layout view illustrating a relative arrangement relationship of pixels of a display panel according to an embodiment.

Referring to FIGS. 6 and 7, the first area DP11 of the first display panel DP1 includes a plurality of pixels, and each pixel includes an emission area EMA.

The emission area EMA may overlap an opening of a pixel defining film PDL (see FIG. 9), and may be defined by the opening of the pixel defining film PDL. A non-emission area NEM is disposed between the emission areas EMA of the respective pixels. The non-emission area NEM may overlap the pixel defining film PDL (see FIG. 9), and may be defined by the pixel defining film PDL. The non-emission area NEM may surround the emission area EMA. The non-emission area NEM has a lattice shape or a mesh shape in which it is disposed along a diagonal direction crossing the first direction DR1 and the second direction DR2 in a plan view.

The pixels may include first color pixels (e.g., red pixels), second color pixels (e.g., blue pixels), and third color pixels (e.g., green pixels). The emission area EMA of each color pixel may have a substantially octagonal shape or rectangular shape or rhombic shape with rounded corners. However, embodiments are not limited thereto, and each emission area EMA may have, for example, a circular shape, a rhombic shape, other polygonal shapes, a polygonal shape with rounded corners, etc.

An emission area EMA_R of the first color pixel and an emission area EMA_B of the second color pixel may have rhombic shapes with rounded corners, and may have shapes similar to each other. The emission area EMA_B of the second color pixel may be greater than the emission area EMA_R of the first color pixel.

An emission area EMA_G of the third color pixel may be smaller than the emission area EMA_R of the first color pixel. The emission area EMA_G of the third color pixel may have a tetratagonal shape inclined in a diagonal direction and having a maximum width in an inclined direction. The third color pixels may include a third color pixel of which an emission area EMA_G1 is inclined in a first diagonal direction x and a third color pixel of which an emission area EMA_G2 is inclined in a second diagonal direction y.

The respective color pixels may be arranged in various manners. In an embodiment, the first color pixels (e.g., red pixels) and the second color pixels (e.g., blue pixels) may be alternately arranged while forming a first row along the second direction DR2, and the third color pixels (e.g., green pixels) may be arranged along the second direction DR2 in a second row adjacent to the first row. The pixels (third color pixels) belonging to the second row may be misaligned with the pixels belonging to the first row in the second direction DR2. In the second row, the third color pixels inclined in the first diagonal direction x and the third color pixels inclined in the second diagonal direction y may be alternately arranged along the second direction DR2. The number of third color pixels belonging to the second row may be twice the number of first color pixels or the number of second color pixels belonging to the first row.

A third row may have the same arrangement of color pixels as that of the first row, but the arrangement order of the color pixels in the third row may be opposite to that of the first row. That is, the second color pixels may be disposed in the third row belonging to the same columns as the first color pixels of the first row, and the first color pixels may be disposed in the third row belonging to the same columns as the second color pixels of the first row. A fourth row may have the same arrangement of the third color pixels as that of the second row, but the arrangement order of the color pixels in the fourth row may be opposite to that of the second row on the basis of shapes inclined in the diagonal directions. That is, the third color pixels inclined in the second diagonal direction y may be disposed in the fourth row belonging to the same columns as the third color pixels inclined in the first diagonal direction x in the second row, and the third color pixels inclined in the first diagonal direction x may be disposed in the fourth row belonging to the same columns as the third color pixels inclined in the second diagonal direction y in the second row.

Arrangements of the first to fourth rows may be repeated along the first direction DR1. However, the arrangements of the pixels are not limited thereto, and the pixels may be repeated in various arrangements.

Figure 10:
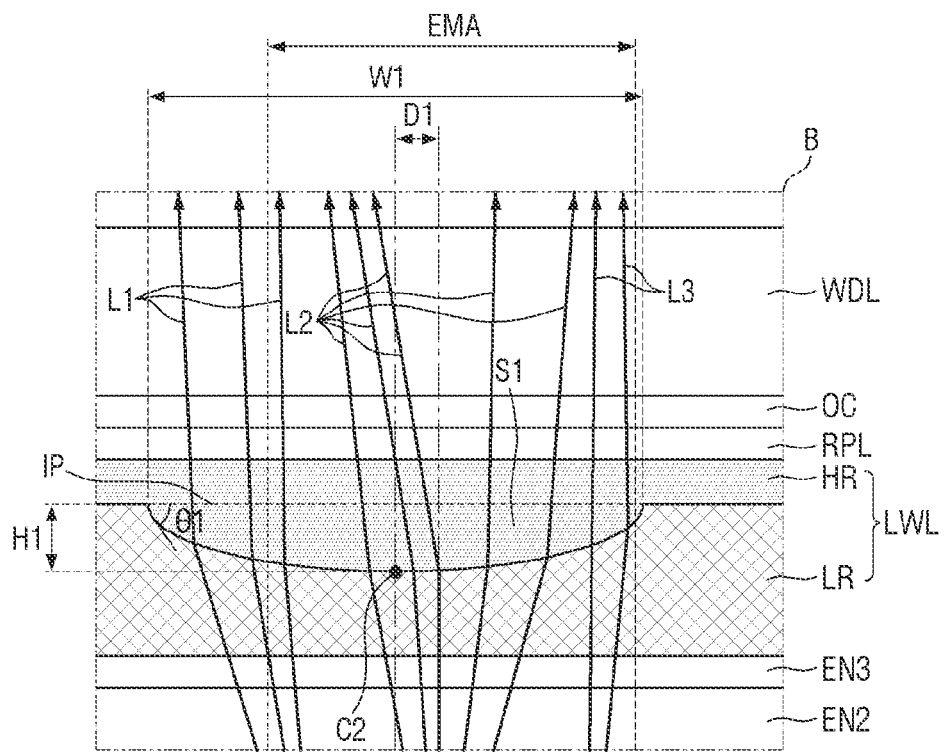
FIG. 10 is an enlarged plan layout view of area B of FIG. 9 according to an embodiment.

The first area DP11 may include a low refraction film LR and a high refraction pattern HR formed on the low refraction film LR, and the high refraction pattern HR may include first convex surfaces S1 (see FIG. 10).

The first convex surface S1 (see FIG. 10) of the high refraction pattern HR may be spaced apart from the center of the each pixel by a predetermined interval in the second diagonal direction y. Different intervals exist between the first convex surface S1 (see FIG. 10) and the emission area EMA. Intervals between the first convex surface S1 (see FIG. 10) and the emission area EMA may refer to intervals between edges where a lower surface and side surfaces of the first convex surface S1 (see FIG. 10) meet and edges where an upper surface and side surfaces of the organic emission layer OEL meet, in a plan view.

In addition, a refractive index of the high refraction pattern HR may be greater than that of the low refraction film LR. The refractive index of the low refraction film LR may be in the range of about 1.46 to about 1.48 or may be greater than about 1 and smaller than about 1.5, and the refractive index of the high refraction pattern HR may be in the range of about 1.73 to about 1.8. Accordingly, light emitted from the emission area EMA may be refracted due to a difference in refractive index between the low refraction film LR and the high refraction pattern HR.

Referring to FIG. 6, first convex surfaces S1 (see FIG. 10) formed of the high refraction pattern HR in each of the first area DP11 to the fourth area DP14 of the first display panel DP1 may be spaced apart from the centers C1 (see FIG. 8) of the respective organic emission layers OEL in different directions. For example, on a plane defined by the first direction DR1 and the second direction DR2, first convex surfaces S1 of the first area DP11 of the first display panel DP1 may be spaced apart from the centers C1 of the respective organic emission layers OEL by a predetermined interval in an upper left direction of the second diagonal direction y, convex surfaces S4 of the fourth area DP14 of the first display panel DP1 may be spaced apart from the centers C1 of the respective organic emission layers OEL by a predetermined interval in a lower right direction of the first diagonal direction x, convex surfaces S2 of the second area DP12 of the first display panel DP1 may be spaced apart from the centers C1 of the respective organic emission layers OEL by a predetermined interval in an upper right direction in an opposite direction to the first diagonal direction x, and convex surfaces S3 of the third area DP13 of the first display panel DP1 may be spaced apart from the centers C1 of the respective organic emission layers OEL by a predetermined interval in a lower left direction in an opposite direction to the second diagonal direction y.

In some embodiments, convex surfaces of the fifth area DP21 to the eighth area DP24 of the second display panel DP2 may also be spaced apart from the centers C1 of the respective organic emission layers OEL in the same directions as the first convex surfaces S1 to the fourth convex surfaces S4 of the first area DP11 to the fourth area DP14 of the first display panel DP1, respectively. The convex surface according to the low refraction film LR and the high refraction pattern HR will be described below.

Figure 8:
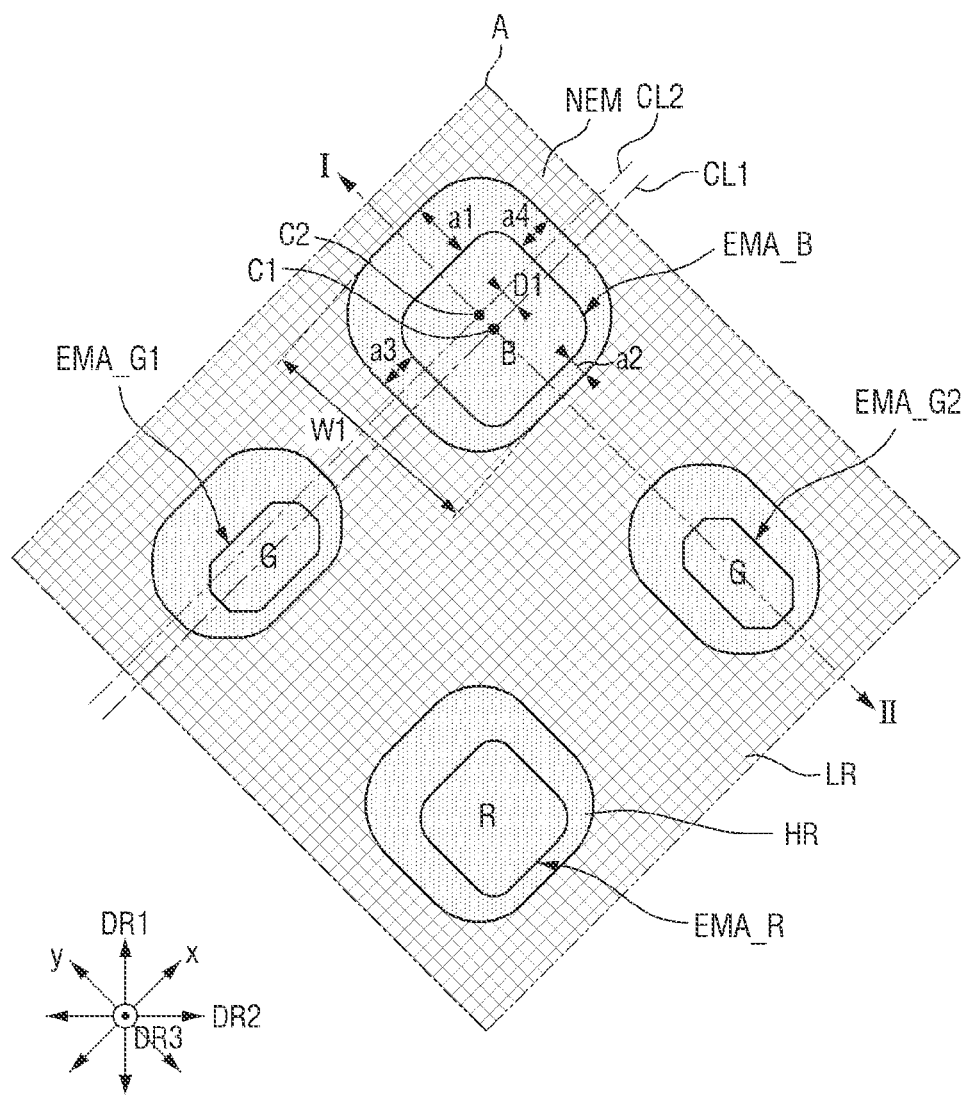
FIG. 8 is an enlarged plan view of area A of FIG. 7 according to an embodiment.
Figure 9:
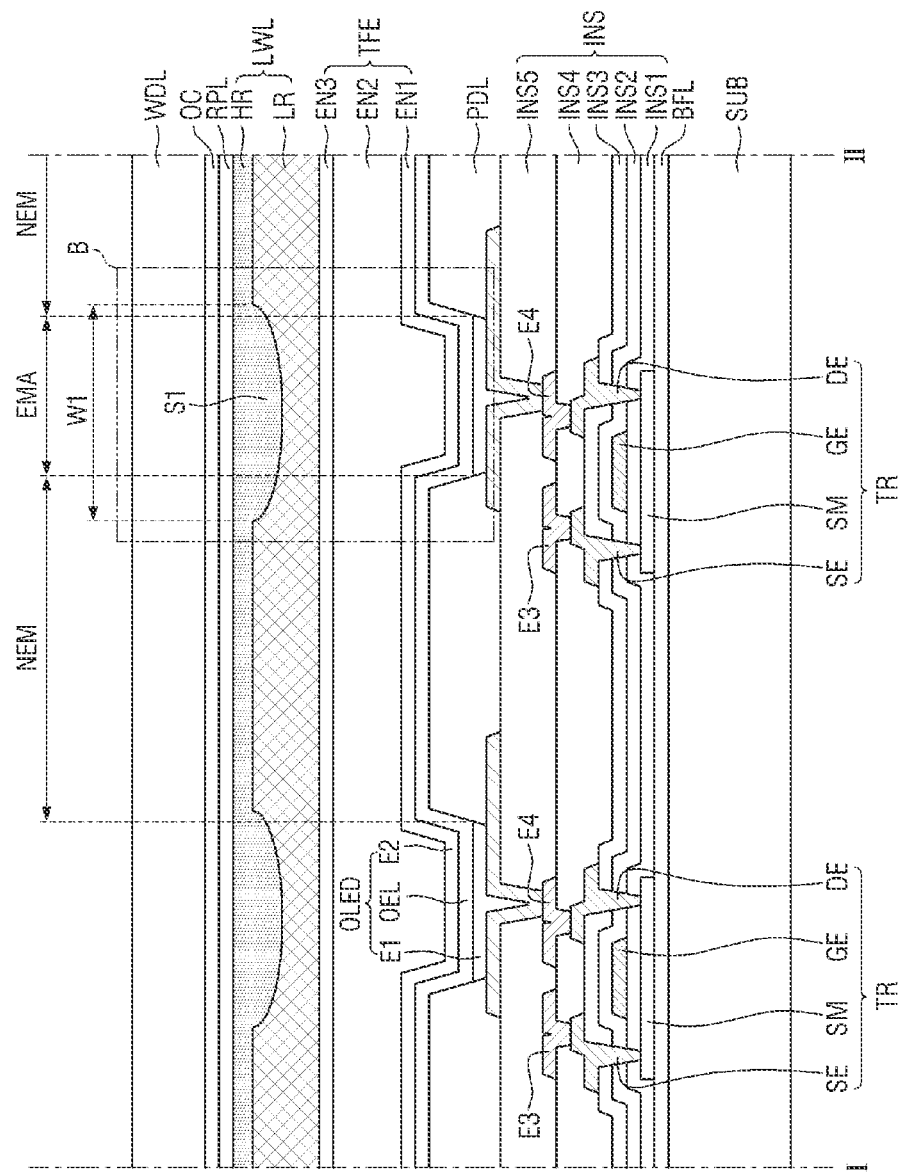
FIG. 9 is a cross-sectional view of one pixel of the display device according to an embodiment.

FIG. 8 is an enlarged plan view of area A of FIG. 7 according to an embodiment. FIG. 9 is a cross-sectional view of one pixel of the display device according to an embodiment. FIG. 10 is an enlarged plan layout view of area B of FIG. 9 according to an embodiment.

Referring to FIGS. 8 and 9, the first area DP11 of the first display panel DP1 includes a substrate SUB, a buffer layer BFL, transistors TR, an insulating layer INS, data lines E3, connection electrodes E4, light emitting elements OLED, a pixel defining film PDL, a thin film encapsulation layer TFE, a light path changing layer LWL, an anti-reflection layer RPL, an adhesive layer OC, and a passivation layer WDL.

Each of the above-described layers may be formed as a single film, but may also be formed as a stacked film including a plurality of films. Another layer may also be further disposed between the respective layers.

The substrate SUB supports the respective layers disposed thereon. The substrate SUB may be made of an insulating material such as a polymer resin. Examples of the polymer resin include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or combinations thereof. The substrate SUB may be a flexible substrate that may be bent, folded, and rolled. A material constituting the flexible substrate may be, for example, polyimide (PI), but is not limited thereto.

The buffer layer BF is disposed on the substrate SUB. The buffer layer BFL may prevent diffusion of impurity ions, prevent permeation of moisture or external air, and perform a surface planarization function. The buffer layer BFL may include, for example, silicon nitride, silicon oxide, silicon oxynitride, etc. The buffer layer BFL may be omitted depending on, for example, a type of the substrate SUB, a process condition, etc.

The transistor TR may include a semiconductor layer SM, a gate electrode GE, a source electrode SE, and a drain electrode DE, and the insulating layer INS may include a first insulating layer INS1, a second insulating layer INS2, a third insulating layer INS3, a fourth insulating layer INS4, and a fifth insulating layer INS5. Hereinafter, the transistor TR and the insulating layer INS will be described.

The semiconductor layer SM is disposed on the buffer layer BFL. The semiconductor layer SM forms a channel of the transistor of the pixel. The semiconductor layer SM may include polycrystalline silicon. However, embodiments are not limited thereto, and the semiconductor layer SM may include, for example, single crystal silicon, amorphous silicon, or an oxide semiconductor. The oxide semiconductor may include, for example, a binary compound (ABx), a ternary compound (ABxCy), or a quaternary compound (ABxCyDz) containing, for example, indium, zinc, gallium, tin, titanium, aluminum, hafnium (Hf), zirconium (Zr), magnesium (Mg), etc.

The first insulating layer INS1 may be disposed on the semiconductor layer SM, and may be a gate insulating film having a gate insulating function. The first insulating layer INS1 may include, for example, a silicon compound, a metal oxide, etc. For example, the first insulating layer INS1 may include silicon oxide, silicon nitride, silicon oxynitride, aluminum oxide, tantalum oxide, hafnium oxide, zirconium oxide, titanium oxide, etc. These materials may be used alone or in combination with each other. The first insulating layer INS1 may be a single film or a multilayer film including stacked films made of different materials.

The gate electrode GE is disposed on the first insulating layer INS1. The gate electrode GE may overlap a channel region of the semiconductor layer SM. The gate electrode GE may include a gate electrode of the transistor of the pixel, a scan line connected to the gate electrode, and a storage capacitor electrode.

The gate electrode GE may include one or more metals such as, for example, molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The gate electrode GE may be a single film or a multilayer film.

The second insulating layer INS2 is disposed on the gate electrode GE. The second insulating layer INS2 may be an interlayer insulating film. The second insulating layer INS2 may include an inorganic insulating material such as, for example, silicon oxide, silicon nitride, silicon oxynitride, hafnium oxide, aluminum oxide, titanium oxide, tantalum oxide, or zinc oxide.

The third insulating layer INS3 is disposed on the second insulating layer INS2. The third insulating layer INS3 may be an interlayer insulating film.

The third insulating layer INS3 may include an inorganic insulating material such as, for example, silicon oxide, silicon nitride, silicon oxynitride, hafnium oxide, aluminum oxide, titanium oxide, tantalum oxide, or zinc oxide or an organic insulating material such as, for example, a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). The third insulating layer INS3 may be a single film or a multilayer film including stacked films made of different materials.

The source electrode SE and the drain electrode DE of the transistor TR are disposed on the third insulating layer INS3. The source electrode SE and the drain electrode DE may be source and drain conductive layers, respectively. The source electrode SE and the drain electrode DE of the transistor TR may be electrically connected to a source region and a drain region of the semiconductor layer SM through contact holes penetrating through the third insulating layer INS3, the second insulating layer INS2, and the first insulating layer INS1, respectively.

The source electrode SE and the drain electrode DE may include one or more metals such as, for example, aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Each of the source electrode SE and the drain electrode DE may be a single film or a multilayer film. For example, each of the source electrode SE and the drain electrode DE may be formed in a stacked structure of Ti/Al/Ti, Mo/Al/Mo, Mo/AlGe/Mo, Ti/Cu, etc.

The fourth insulating layer INS4 is disposed on the source electrode SE and the drain electrode DE. The fourth insulating layer INS4 covers the source electrode SE and the drain electrode DE. The fourth insulating layer INS4 may be a via layer. The fourth insulating layer INS4 may include the same material as the third insulating layer INS3 described above or may include one or more materials selected from materials exemplified as the materials of the third insulating layer INS3.

The fourth insulating layer INS4 may be disposed on the entire surfaces of the third insulating layer INS3, the source electrode SE, and the drain electrode DE while covering all of the third insulating layer INS3, the source electrode SE, and the drain electrode DE.

The data line E3 and the connection electrode E4 are disposed on the fourth insulating layer INS4. The data line E3 and the connection electrode E4 may be source/drain conductive layers. The data line E3 may be electrically connected to the source electrode SE of the transistor TR through a contact hole penetrating through the fourth insulating layer INS4 in the pixel. The connection electrode E4 may be electrically connected to the drain electrode DE of the transistor TR through a contact hole penetrating through the fourth insulating layer INS4.

The data line E3 and the connection electrode E4 may include one or more metals such as, for example, aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The data line E3 and the connection electrode E4 may be a single film or a multilayer film. The data line E3 and the connection electrode E4 may be made of the same material as the source electrode SE and the drain electrode DE, but are not limited thereto.

The data line E3 and the connection electrode E4 may include aluminum, which is a material having flexible characteristics. For example, the source electrode SE and the drain electrode DE, and the data line E3 and the connection electrode E4, may include a Ti/Al/Ti stacked film.

The fifth insulating layer INS5 is disposed on the data line E3 and the connection electrode E4. The fifth insulating layer INS5 may be disposed on the entire surfaces of the data line E3 and the connection electrode E4 while covering both the data line E3 and the connection electrode E4.

The fifth insulating layer INS5 may be a via layer including an organic material. The fifth insulating layer INS5 may include an organic insulating material such as, for example, a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB).

The light emitting element OLED may include a first electrode E1, a second electrode E2, and an organic emission layer OEL, and a pixel partition wall layer PW may include a pixel defining film PDL and a spacer.

The first electrode E1 of the light emitting element OLED is disposed on the fifth insulating layer INS5 of the display area DA. An anode electrode of the light emitting element OLED may be formed as the first electrode E1. The anode electrode may be electrically connected to the connection electrode E4 through a contact hole penetrating through the fifth insulating layer INS5, and may be connected to the drain electrode DE of the transistor through the connection electrode E4.

The first electrode E1 may have a stacked film structure in which a material layer having a high work function, made of, for example, indium tin oxide (ITO), indium zinc oxide (IZO), zinc oxide (ZnO), or indium oxide (In2O3) and a reflective material layer made of silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or mixtures thereof are stacked, but is not limited thereto. The material layer having the high work function may be disposed at a layer above the reflective material layer to be disposed close to the organic emission layer OEL. The first electrode E1 may have a multilayer structure of, for example, ITO/Mg, ITO/MgF, ITO/Ag, and ITO/Ag/ITO, but is not limited thereto.

The pixel defining film PDL may be disposed on the first electrode E1.

The pixel defining film PDL is disposed along a boundary of the organic emission layer OEL. The pixel defining film PDL may be disposed on the fifth insulating layer INS and the first electrode E1. The non-emission area NPA and the light emission area PA may be divided by the pixel defining film PDL.

The pixel defining film PDL may include an organic insulating material such as, for example, a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). In addition, the pixel defining film PDL may also include an inorganic material.

A spacer may be disposed on a partial area of the pixel defining film PDL. The spacer may be disposed directly on the pixel defining film PDL. The spacer may overlap the pixel defining film PDL in a thickness direction, may be disposed on a partial area of the pixel defining film PDL, and may have a smaller width than the pixel defining film PDL. The spacer may serve to maintain an interval between a structure disposed thereon and the pixel defining film.

The spacer may include an organic insulating material, similar to the pixel defining film PDL. It has been described by way of example that in an embodiment, the pixel defining film PDL and the spacer are formed integrally with each other using the same material, but embodiments are not limited thereto. That is, in an embodiment, the pixel defining film PDL may be made of a first insulating material, and the spacer may be made of a second insulating material, such that the pixel defining film PDL and the spacer may be formed in a stacked structure.

The organic emission layer OEL is disposed in the opening of the pixel defining film PDL. The organic emission layer OEL may include an organic material capable of generating any one of red light, green light, and blue light. The organic emission layer OEL may generate any one of the red light, the green light, and the blue light. However, embodiments are not limited thereto, and the organic emission layer OEL may also generate white light by a combination of organic materials generating the red light, the green light, and the blue light. In addition, the organic emission layer OEL may include an inorganic emission layer made of an inorganic semiconductor material. When the organic emission layer OEL includes an organic semiconductor material, the organic emission layer OEL may include an organic emission layer, hole injection/transport layers, and electron injection/transport layers.

The second electrode E2 is disposed on the organic emission layer OEL. In an embodiment, the second electrode E2 may be disposed on the organic emission layer OEL, the pixel defining film PDL, and the spacer of the display area DA, and is not disposed in the non-display area NDA. A cathode electrode may be formed as the second electrode E2. The cathode electrode CAT may be disposed over the entire display area DA. The second electrode E2 may include a material layer having a small work function, such as, for example, Li, Ca, LiF/Ca, LiF/Al, Al, Mg, Ag, Pt, Pd, Ni, Au, Nd, Ir, Cr, BaF, Ba, or compounds or mixtures thereof (e.g., a mixture of Ag and Mg, etc.). The second electrode E2 may further include a transparent metal oxide layer disposed on the material layer having the small work function.

The thin film encapsulation layer TFE is disposed on the second electrode E2 of the display area DA. The thin film encapsulation layer TFE may be disposed on the substrate SUB so as to cover the pixels.

The thin film encapsulation layer TFE may include a first encapsulation layer EN1, a second encapsulation layer EN2, and a third encapsulation layer EN3.

The first encapsulation layer EN1 is disposed on the substrate SUB so as to cover the light emitting element OLED.

The first encapsulation layer EN1 may be disposed on the substrate SUB so as to cover the organic emission layer OEL of the display area DA and the second electrode E2 of the non-display area NDA, and may be spaced apart from a distal end of the substrate SUB by a predetermined interval.

The first encapsulation layer EN1 includes an inorganic material. For example, the inorganic material of the first encapsulation layer EN1 may include one or more of, for example, silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON). For example, when the first encapsulation layer EN1 includes silicon oxynitride (SiON), composition ratios of silicon (Si), oxygen (O), and nitrogen (N) of silicon oxynitride (SiON) may be different from each other. The first encapsulation layer EN1 may prevent external oxygen and moisture from permeating into the light emitting element OLED.

The second encapsulation layer EN2 is disposed on the first encapsulation layer EN1. The second encapsulation layer EN2 may cover the first encapsulation layer EN1, and may be spaced apart from the distal end of the substrate SUB by a predetermined interval.

The second encapsulation layer EN2 may be formed by curing an organic material having fluidity. For example, the second encapsulation layer EN2 may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). The second encapsulation layer EN2 may serve to planarize an upper surface of the display area DA.

The third encapsulation layer EN3 is disposed on the first encapsulation layer EN1 so as to cover the second encapsulation layer EN2. Accordingly, the second encapsulation layer EN2 may be sealed by the first encapsulation layer EN1 and the third encapsulation layer EN3.

The third encapsulation layer EN3 may include an inorganic material different from that of the first encapsulation layer EN1. For example, the third encapsulation layer EN3 may include silicon nitride (SiNx). The third encapsulation layer EN3 may prevent external oxygen and moisture from permeating into the light emitting element OLED.

The light path changing layer LWL is disposed on the third encapsulation layer EN3. The light path changing layer LWL may include a low refraction film LR formed on the third encapsulation layer EN3 and a high refraction pattern HR formed on the low refraction film LR.

The low refraction film LR of the light path changing layer LWL is disposed on the third encapsulation layer EN3. The low refraction film LR may cover an upper surface of the emission area EMA and may be disposed over the emission area EMA and the non-emission area NEM.

A thickness of the low refraction film LR may be, for example, in the range of about 3 μm to about 10 μm or in a range of about 3 μm to about 30 μm, but is not limited thereto. The thickness of the low refraction film LR may refer to the thickness from an interface between the low refraction film LR and the third encapsulation layer EN3 to an upper surface of the low refraction film LR, and may refer to an average thickness in the entire area of the low refraction film LR.

A refractive index of the low refraction film LR may be in the range of about 1.46 to about 1.48, or may be greater than about 1 and smaller than about 1.5.

The low refraction film LR may include an organic material. For example, the low refraction film LR may include at least one of, for example, an acrylic resin, an epoxy resin, a phenolic resin, a polyamide resin, a polyimide resin, etc., but is not limited thereto. For example, the material that may be included in the low refraction film LR is not limited as long as it is a material having the refractive index in the above-described range or a mixture of a plurality of materials.

The high refraction pattern HR may be disposed on the low refraction film LR. The high refraction pattern HR may be disposed on the upper surface of the emission area EMA, and may cover the upper surface of the low refraction film LR on the emission area EMA. The high refraction pattern HR may be disposed over the entire area of the emission area EMA, and may include an area greater than that of the emission area EMA in a plan view. Accordingly, the entire area of each emission area EMA may overlap the high refraction pattern HR in the thickness direction (third direction DR3), and the entire area of the organic emission layer OEL may overlap the high refraction pattern HR in the thickness direction (third direction DR3). That is, in the emission area EMA, the high refraction pattern HR may be disposed on the low refraction film LR, and the light emitted from the organic emission layer OEL may sequentially pass through the low refraction film LR and the high refraction pattern HR.

A thickness of the high refraction pattern HR may be, for example, in the range of about 2 μm to about 2.5 μm or be in the range of about 1.2 μm to about 3 μm, but is not limited thereto. The thickness of the high refraction pattern HR may refer to the thickness from an interface between the high refraction pattern HR and the low refraction film LR to an upper surface of the high refraction pattern HR, and may refer to an average thickness of each high refraction pattern HR.

Intervals between side surfaces of the high refraction pattern HR and side surfaces of the organic emission layer OEL in a plan view may refer to intervals between edges where a lower surface and the side surfaces of the high refraction pattern HR meet and edges where an upper surface and the side surfaces of the organic emission layer OEL meet in a plan view. The interval between the side surface of the high refraction pattern HR and the side surface of the organic emission layer OEL may be in the range of about 2.5 μm to about 4.0 μm or be in the range of about 1.5 μm to about 5 μm, but is not limited thereto.

A refractive index of the high refraction pattern HR may be greater than that of the low refraction film LR. For example, the refractive index of the high refraction pattern HR may be in the range of about 1.73 to about 1.8. As described above, the refractive index of the low refraction film LR may be in the range of about 1.46 to about 1.48, or may be greater than about 1 and smaller than about 1.5, and a difference between the refractive indices of the high refraction pattern HR and the low refraction film LR may be about 0.25 to about 0.34. Accordingly, when the light of the organic emission layer OEL is emitted toward a top surface, the light of the organic emission layer OEL may be refracted due to the difference between refractive indices, such that a light path may be changed.

The high refraction pattern HR may include the same organic material as the low refraction film LR, and may include a metal-type or an organic or inorganic-type high refraction material. For example, the high refraction pattern HR may include at least one of, for example, silver (Ag), platinum (Pt), zinc oxide ($ZnO_x$), cadmium selenide (CdSe), plumbum ziconate titanate (PZT), lead zirconate titantate (PLZT), which is translucent ceramic, barium titanate (Ba-$TiO_3$), aluminum oxide ($Al_2O_3$), copper (Cu), nickel (Ni), etc. However, embodiments are not limited thereto, and the material that may be included in the high refraction pattern HR is not limited thereto as long as it is a material allowing the high refraction pattern HR to have the refractive index in the above-described range or a mixture of a plurality of materials.

Referring to FIGS. 8 to 10, the lower surface of the high refraction pattern HR and the upper surface of the low refraction film LR may be in contact (e.g., direct contact) with each other. The lower surface of the high refraction pattern HR and the upper surface of the low refraction film LR may have complementary shapes on a contact surface through the contact therebetween. For example, an interface of complementary shapes generated by the contact between the lower surface of the high refraction pattern HR and the upper surface of the low refraction film LR may have each of a pattern surface (a convex surface based on the high refraction pattern HR and a concave surface based on the low refraction film LR) and a flat surface. A lower surface of the low refraction film LR and the upper surface of the high refraction pattern HR may be substantially flat and be substantially parallel to each other.

The high refraction pattern HR may have a convex shape as the complementary shape on a surface in which the high refraction pattern HR and the low refraction film LR are in contact (e.g., direct contact) with each other. For example, the high refraction pattern HR may have a shape of a convex lens on a surface thereof in contact with the low refraction film LR positioned in an area corresponding to each organic emission layer OEL, and the high refraction pattern HR may have a first convex surface S1 convex toward an opposite direction to an emission direction (hereinafter, referred to as a "fourth direction") of the light emitted from the organic emission layer OEL.

A width W1 of the first convex surface S1 may be greater than a width of the emission area EMA of the organic emission layer OEL. For example, the first convex surface S1 may have a size corresponding to that of the organic emission layer OEL in an arrangement direction of each of the organic emission layers OEL, and may have a size sufficient to cover the emission area EMA on an upper surface of the organic emission layer OEL. When the first convex surface S1 is greater than the width of the emission area EMA, the first convex surface S1 may have a width W1 within the range of about 1.2 to about 2 times the width of the emission area EMA of the organic emission layer OEL. Alternatively, the first convex surface S1 may have a width W1 within the range of about 12 μm to about 20 μm. The first convex surface S1 may have a radius of curvature of about 5 to about 20.

The first convex surface S1 may, for example, have a thickness H1 within the range of about 1/6 to about 1/8 of the width W1 of the first convex surface S1. Alternatively, the thickness H1 of the first convex surface S1 may be in the range of about 2 μm to about 2.5 μm or be in the range of about 1.2 μm to about 3 μm. The thickness of the first convex surface S1 may refer to a thickness from an interface between the center of the first convex surface S1 and the low refraction film LR to an upper surface of the first convex surface S1, and may refer to an average thickness of each first convex surface S1.

The first convex surface S1 has a predetermined angle with respect to an imaginary plane IP extending from an edge of the first convex surface S1 along a transverse direction. That is, the first convex surface S1 may have a first inclination angle θ1, which is an angle formed by a surface of the first convex surface S1 with respect to the imaginary plane IP at the edge of the first convex surface S1. For example, the first inclination angle θ1 may have an angle according to the width W1, the thickness H1, and the radius of curvature of the first convex surface S1. A side viewing angle of the light emitted from the organic emission layer OEL may be secured through the shape of the convex lens having the first inclination angle θ1.

Side surfaces of the first convex surface S1 and side surfaces of the emission area EMA may be spaced apart from each other by a predetermined interval. For example, in a case of the first area DP11 of FIGS. 8 and 9, as described above, on the plane defined by the first direction DR1 and the second direction DR2, the first convex surfaces S1 of the first area DP11 may be spaced apart from the centers C1 of the organic emission layers OLE by a predetermined interval in the upper left direction of the second diagonal direction y.

A distance between the first convex surface S1 and the center C1 of the organic emission layer OLE spaced apart from each other may be defined as a first distance D1, which is a distance between a first center line CL1 connecting the centers C1 of the respective organic emission layers OEL to each other in the first diagonal direction x and a second center line CL2 connecting the centers C2 of the respective first convex surfaces S1 of the high refraction pattern HR to each other in the first diagonal direction x. That is, the first convex surface S1 may be spaced apart from the center C1 of the organic emission layer OEL by the first distance D1 in the second diagonal direction y, which is a direction substantially perpendicular to the first center line CL1 and the second center line CL2 in the first diagonal direction x, and this distance coincides with a distance by which the center C2 of the first convex surface S1 and the center C1 of the organic emission layer OEL are spaced apart from each other in the second diagonal direction y (upper left direction of FIG. 8).

Accordingly, the first center line CL1 of the organic emission layer OEL may deviate from the second center line CL2 of the first convex surface S1. For example, the first distance D1 between the first convex surface S1 and the center C1 of the organic emission layer OEL in the second diagonal direction y may be within the range of about 1/6 to about 1/4 of the width W1 of the first convex surface S1. Alternatively, the first distance D1 may be within the range of about 1/10 to about 1/4 of the width W1 of the first convex surface S1. As described above, since the first convex surface S1 may cover the upper surface of the emission area EMA, the first distance D1 by which the first convex surface S1 is spaced apart from the center C1 of the organic emission layer OLE may be within a range in which the entire area of the emission area EMA overlaps the first convex surface S1 in the thickness direction.

Accordingly, the high refraction pattern HR includes two edges positioned in a direction of the width W1 and two edges positioned in the first diagonal direction x. When an edge relatively distant from the first origin CC1 of the first display panel DP1, of the two edges in the direction of the width W1 is defined as a first edge and an edge close to the first origin CC1, of the two edges is defined as a second edge, a first interval a1 between each emission area EMA covered by the high refraction pattern HR and the first edge may be greater than a second interval a2 between each emission area EMA and the second edge.

On the plane defined by the first direction DR1 and the second direction DR2, intervals between the side surfaces of the first convex surface S1 of the high refraction pattern HR and the side surfaces of the organic emission layer OEL may be different from each other. The intervals between the edges of the first convex surface S1 and the edges of the organic emission layer OEL may include a first interval a1 between the side surface of the first convex surface S1 and the side surface of the organic emission layer OEL in a direction (second diagonal direction y) from the first center line CL1 of the organic emission layer OEL toward the second center line CL2 of the first convex surface S1 spaced apart from the first center line CL1 by the first distance D1, a second interval a2 between the side surface of the first convex surface S1 and the side surface of the organic emission layer OEL in an opposite direction to the direction from the first center line CL1 of the organic emission layer OEL toward the second center line CL2 of the first convex surface S1, and a third interval a3 and a fourth interval a4 between the side surfaces of the first convex surface S1 and the side surfaces of the organic emission layer OEL in the first diagonal direction x.

A size of the first interval a1 between the side surface of the first convex surface S1 and the side surface of the organic emission layer OEL may be greater than a size of the second interval a2. For example, when the second center line CL2 of the first convex surface S1 is spaced apart from the first center line CL1 of the organic emission layer OEL by the first distance D1, the first interval a1 may be greater than the second interval a2 by about ⅓ to about ½ of the width W1 of the first convex surface S1 or be greater than the second interval a2 by about ⅕ to about ½ of the width W1 of the first convex surface S1.

As the first convex surface S1 is spaced apart from the center C1 of the organic emission layer OLE by the first distance D1 in the second diagonal direction y, the third interval a3 and the fourth interval a4, which are intervals between the side surfaces of the first convex surface S1 and the side surfaces of the organic emission layer OEL in the first diagonal direction x, may be the same as each other. However, embodiments are not limited thereto, and the third interval a3 and the fourth interval a4 may also be different from each other as long as the first convex surface S1 covers the emission area EMA on the upper surface of the organic emission layer OEL.

Only the first center line CL1 of each pixel has been illustrated by way of example, but according to embodiments, the first center line CL1 and the second center line CL2 may be spaced apart from each other by the first distance D1 also in a plurality of pixels arranged in the first diagonal direction x in the first area DP11.

The first convex surfaces S1 (see FIG. 10) formed of the high refraction pattern HR in the first area DP11 to the fourth area DP14 of the first display panel DP1 may be spaced apart from the centers C1 (see FIG. 10) of the respective organic emission layers OEL in different directions. For example, on a plane defined by the first direction DR1 and the second direction DR2, the first convex surfaces S1 of the first area DP11 of the first display panel DP1 may be spaced apart from the centers C1 of the respective organic emission layers OEL by a predetermined interval in the upper left direction of the second diagonal direction y, the convex surfaces S4 of the fourth area DP14 of the first display panel DP1 may be spaced apart from the centers C1 of the respective organic emission layers OEL by a predetermined interval in the lower right direction of the first diagonal direction x, the convex surfaces S2 of the second area DP12 of the first display panel DP1 may be spaced apart from the centers C1 of the respective organic emission layers OEL by a predetermined interval in the upper right direction in the opposite direction to the first diagonal direction x, and the convex surfaces S3 of the third area DP13 of the first display panel DP1 may be spaced apart from the centers C1 of the respective organic emission layers OEL by a predetermined interval in the lower left direction in the opposite direction to the second diagonal direction y.

Referring to FIG. 10, light L1, light L2, and light L3 emitted from the organic emission layer OEL are emitted toward the upper surface and the side surfaces of the organic emission layer OEL.

In this case, the first convex surface S1 serves to collect the light emitted from each emission area EMA within a specific angle. For example, the low refraction film LR is disposed in the emission area EMA, the high refraction pattern HR is disposed on the low refraction film LR, and the first convex surface S1 is disposed to be spaced apart from the center C1 of the organic emission layer OLE by the first distance D1, such that emission efficiency of the light L1, the light L2, and the light L3 emitted from the organic emission layer OEL may be increased. For example, when the light L2 emitted toward a front surface travels to outside of the display device through the first convex surface S1, the emitted light L2 may be refracted from a front surface direction to a side surface direction and travel in the side surface direction by a difference in refractive index between the low refraction film LR and the first convex surface S1 of the high refraction pattern HR spaced apart from the center C1 of the organic emission layer OLE by the first distance D1. In addition, when the light L1 and the light L3 emitted toward the side surface travel to outside of the display device through edge portions of the first convex surface S1, the emitted light L1 and the emitted light L3 may be refracted to travel close to the front surface direction by the difference in the refractive index between the low refraction film LR and the first convex surface S1 of the high refraction pattern HR spaced apart from the center C1 of the organic emission layer OLE by the first distance D1.

Accordingly, the light L1, the light L2, and the light L3 emitted to a front surface direction and all directions of the display device 1 may be collected within a specific angle to secure luminance of a light source at a predetermined side viewing angle. As described above, in a case of the display device 1 including the multi-channel lens, the respective areas of the first display panel DP1 may refract and reflect light emitted between about 10° and about 50° with respect to a virtual line substantially perpendicular to the emission surface of the organic emission layer OEL among light emitted to the front surface and the side surfaces of the organic emission layer OLE through the respective sub-lenses L11, L12, L13, L14, L21, L22, L23, and L24, and provide the refracted or reflected light to the user's pupils PP. Accordingly, the first convex surface S1 may be spaced apart from the center C1 of the organic emission layer OLE by the first distance D1, and may refract the light L1, the light L2, and the light L3 emitted from the organic emission layer OEL of each area of the display panel DP at a side viewing angle of about 10° to about 50°.

Referring to FIGS. 8 and 9 again, the anti-reflection layer RPL is disposed on the low refraction film LR, and the passivation layer WDL is disposed on the anti-reflection layer RPL. The adhesive layer OC may be further disposed between the anti-reflection layer RPL and the passivation layer WDL. The anti-reflection layer RPL and the passivation layer WDL may be adhered to each other by the adhesive layer OC. The adhesive layer OC may be optically transparent. The adhesive layer OC may include, for example, a transparent adhesive member such as an optically clear adhesive (OCA) film or an optically clear resin (OCR).

In an embodiment, when the display device includes the high refraction pattern HR including the first convex surface S1 spaced apart from the center C1 of the organic emission layer OLE by the first distance D1 in an emission surface direction, an angle of the light emitted to the front surface tends to be refracted toward the side surfaces and an angle of the light emitted to the side surfaces tends to be refracted toward the front surface. Accordingly, an amount of light refracted toward the side surfaces increases, such that luminance of the side surfaces may increase.

In addition, light output at about 0° to about 10° in the emission surface direction may be refracted between about 10° and about 50° by the first convex surface S1 spaced apart from the center C1 of the organic emission layer OLE by the first distance D1. In addition, light output at an angle exceeding about 50° in the emission surface direction may also be refracted between about 10° and about 50° by the first convex surface S1 spaced apart from the center C1 of the organic emission layer OLE by the first distance D1. Accordingly, luminance between about 10° and about 50° with respect to the virtual line substantially perpendicular to the emission surface of the organic emission layer OEL may increase.

Accordingly, the high refraction pattern HR may include the first convex surface S1 and thus, collect light spreading in the front surface direction and all directions within a specific angle to secure luminance of the light source at a predetermined side viewing angle. In an embodiment, in the case of the display device including the multi-channel lens, each area of the first display panel DP1 utilizes a viewing angle of about 10° to about 50°. The first convex surface S1 may be spaced apart from the center C1 of the organic emission layer OLE by the first distance D1, and may refract the light L1, the light L2, and the light L3 emitted from the organic emission layer OEL at a side viewing angle of about 10° to about 50°. Accordingly, the luminance of the light source may be secured at a predetermined side viewing angle of the display device 1 through the first convex surface S1 of the light path changing layer LWL, and luminance of the display panel DP of the display device 1 may be increased.

Figure 11:
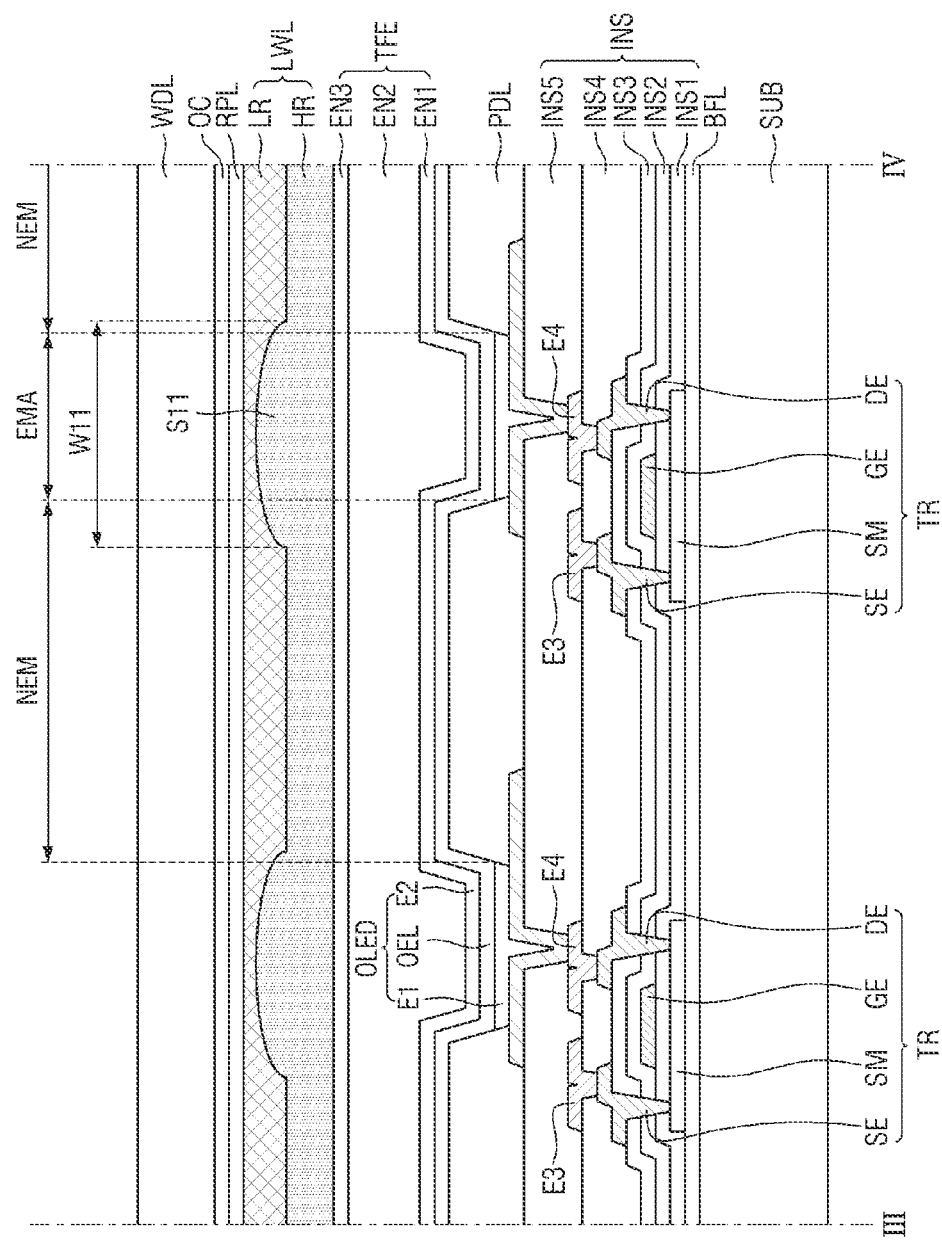
FIG. 11 is a cross-sectional view of one pixel of a display device according to an embodiment.
Figure 12:
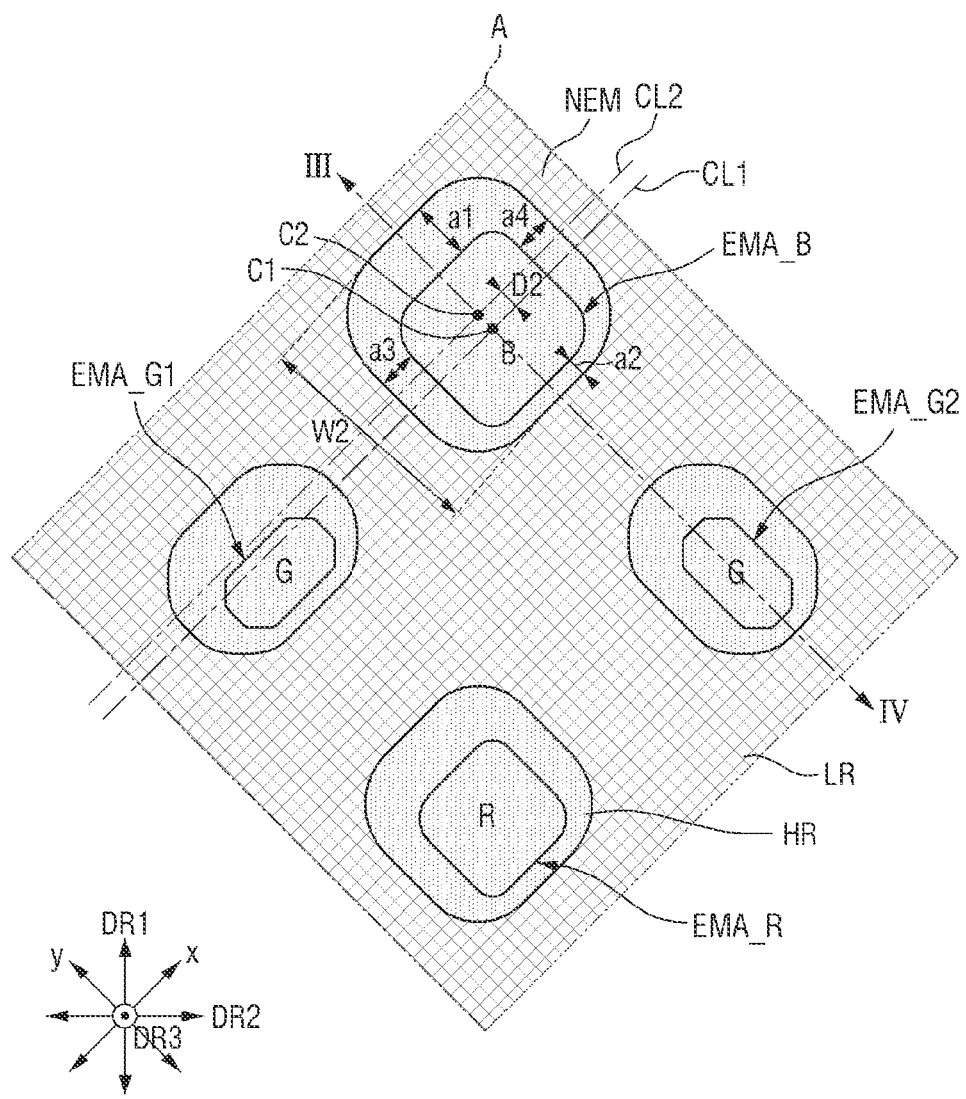
FIG. 12 is an enlarged plan layout view of area C of FIG. 11 according to an embodiment.

FIG. 11 is a cross-sectional view of one pixel of a display device according to an embodiment. FIG. 12 is an enlarged plan layout view of area C of FIG. 11 according to an embodiment.

Referring to FIGS. 11 and 12, a display device 1 according to an embodiment is different from the display device 1 according to an embodiment of FIGS. 7 to 10 in that the high refraction pattern HR of the light path changing layer LWL is formed on the third encapsulation layer EN3 and the low refractive index film LR is formed on the high refraction pattern HR. Accordingly, for convenience of explanation, a further description of technical aspects and components previously described may be omitted.

Referring to FIGS. 11 and 12, the light path changing layer LWL is disposed on the third encapsulation layer EN3. The light path changing layer LWL may include the high refraction pattern HR formed on the third encapsulation layer EN3 and the low refraction film LR formed on the high refraction pattern HR.

The high refraction pattern HR may be disposed on the third encapsulation layer EN3. The high refraction pattern HR may be disposed in the emission area EMA, and may cover an upper surface of the third encapsulation layer EN3 on the emission area EMA. The high refraction pattern HR may be disposed over the entire area of the emission area EMA, and may include an area greater than that of the emission area EMA in a plan view. Accordingly, the entire area of each emission area EMA may overlap the high refraction pattern HR in the thickness direction (third direction DR3), and the entire area of the organic emission layer OEL may overlap the high refraction pattern HR in the thickness direction (third direction DR3).

The high refraction pattern HR may have a convex shape on a surface in which the high refraction pattern HR and the low refraction film LR are in contact (e.g., direct contact) with each other. The high refraction pattern HR may have a shape of a convex lens on a surface thereof in contact with the low refraction film LR positioned in an area corresponding to each organic emission layer OEL. For example, the high refraction pattern HR may have a first concave surface S11 convex toward an emission direction (fourth direction) of the light emitted from the organic emission layer OEL.

A width W11 of the first concave surface S11 may be greater than a width of the emission area EMA of the organic emission layer OEL. For example, the first concave surface S11 may have a size corresponding to that of the organic emission layer OEL in an arrangement direction of each of the organic emission layers OEL, and may have a size sufficient to cover the emission area EMA on an upper surface of the organic emission layer OEL. When the first concave surface S11 is greater than the width of the emission area EMA, the first concave surface S11 may have a width W11 within the range of about 1.2 to about 2 times the width of the emission area EMA of the organic emission layer OEL. Alternatively, the first concave surface S11 may have a width W11 within the range of about 12 μm to about 20 μm. The first concave surface S11 may have a radius of curvature of about 5 to about 20.

Side surfaces of the first concave surface S11 and side surfaces of the emission area EMA may be spaced apart from each other by a predetermined interval. For example, in a case of the first area DP11 of FIG. 12, as described above, on the plane defined by the first direction DR1 and the second direction DR2, the first concave surfaces S11 of the first area DP11 may be spaced apart from the centers C1 of the organic emission layers OLE by a predetermined interval in the upper left direction of the second diagonal direction y.

Accordingly, the first center line CL1 of the organic emission layer OEL may deviate from the second center line CL2 of the first concave surface S11. For example, a second distance D2 between the first concave surface S11 and the center C1 of the organic emission layer OEL in the second diagonal direction y may be within the range of about ⅙ to about ¼ of the width W11 of the first concave surface S11.

Alternatively, the second distance D2 may be within the range of about 1/10 to about 1/4 of the width W11 of the first concave surface S11. As described above, since the first concave surface S11 may cover the upper surface of the emission area EMA, the second distance D2 by which the first concave surface S11 is spaced apart from the center C1 of the organic emission layer OLE may be within a range in which the entire area of the emission area EMA overlaps the first concave surface S11 in the thickness direction.

Accordingly, on the plane defined by the first direction DR1 and the second direction DR2, the high refraction pattern HR includes a plurality of edges positioned in a direction of the width W11. When an edge relatively distant from the first origin CC1 of the first display panel DP1, of two edges of the first concave surface S11 in the direction of the width W11 is defined as a first edge and an edge close to the first origin CC1, of the two edges is defined as a second edge, an interval between each emission area EMA covered by the high refraction pattern HR and the first edge is greater than an interval between each emission area EMA and the second edge. Intervals between edges of the first concave surface S11 of the high refraction pattern HR and edges of the organic emission layer OEL may be different from each other. The intervals between the side surfaces of the first concave surface S11 and the side surfaces of the organic emission layer OEL may include a first interval a1, a second interval a2, a third interval a3 and a fourth interval a4. The first interval a1 is between the side surface of the first concave surface S11 and the side surface of the organic emission layer OEL in a direction (second diagonal direction y) from the first center line CL1 of the organic emission layer OEL toward the second center line CL2 of the first concave surface S11 spaced apart from the first center line CL1 by the second distance D2. The second interval a2 is between the side surface of the first concave surface S11 and the side surface of the organic emission layer OEL in an opposite direction to the direction from the first center line CL1 of the organic emission layer OEL toward the second center line CL2 of the first concave surface S11. The third interval a3 and the fourth interval a4 are between the side surfaces of the first concave surface S11 and the side surfaces of the organic emission layer OEL in the first diagonal direction x.

A size of the first interval a1 between the side surface of the first concave surface S11 and the side surface of the organic emission layer OEL may be greater than a size of the second interval a2. For example, when the second center line CL2 of the first concave surface S11 is spaced apart from the first center line CL1 of the organic emission layer OEL by the second distance D2, the first interval a1 may be greater than the second interval a2 by about 1/3 to about 1/2 of the width W11 of the first concave surface S11 or be greater than the second interval a2 by about 1/5 to about 1/2 of the width W11 of the first concave surface S11.

As the first concave surface S11 is spaced apart from the center C1 of the organic emission layer OLE by the second distance D2 in the second diagonal direction y, the third interval a3 and the fourth interval a4, which are intervals between the side surfaces of the first concave surface S11 and the side surfaces of the organic emission layer OEL in the first diagonal direction x, may be the same as each other. However, embodiments are not limited thereto, and the third interval a3 and the fourth interval a4 may also be different from each other as long as the first concave surface S11 covers the emission area EMA on the upper surface of the organic emission layer OEL.

The low refraction film LR is disposed on the high refraction pattern HR. The low refraction film LR may cover the upper surface of the emission area EMA and may be disposed over the emission area EMA and the non-emission area NEM. In the emission area EMA, the low refraction film LR may be disposed on the high refraction pattern HR, and the light emitted from the emission area EMA may sequentially pass through the high refraction pattern HR and the low refraction film LR.

A refractive index of the high refraction pattern HR may be greater than that of the low refraction film LR. For example, the refractive index of the high refraction pattern HR may be in the range of about 1.73 to about 1.8. As described above, the refractive index of the low refraction film LR may be in the range of about 1.46 to about 1.48 or may be greater than about 1 and smaller than about 1.5, and a difference between the refractive indices of the high refraction pattern HR and the low refraction film LR may be about 0.25 to about 0.34. Accordingly, when the light of the organic emission layer OEL is emitted toward a top surface, the light of the organic emission layer OEL may be refracted due to the difference between refractive indices, such that a light path may be changed.

In an embodiment, even though the low refraction film LR is stacked on the high refraction pattern HR, the first concave surface S11 of the high refraction pattern HR may also collect and refract light spreading in the front surface direction and all directions within a specific angle.

In the case of the display device 1 including the multi-channel lens, the first concave surface S11 may be spaced apart from the center C1 of the organic emission layer OLE by the second distance D2, and may refract the light emitted from the organic emission layer OEL at a side viewing angle of about 10° to about 50°. Accordingly, the luminance of the light source may be secured at a predetermined side viewing angle of the display device 1 through the first concave surface S11 of the light path changing layer LWL.

Figure 13:
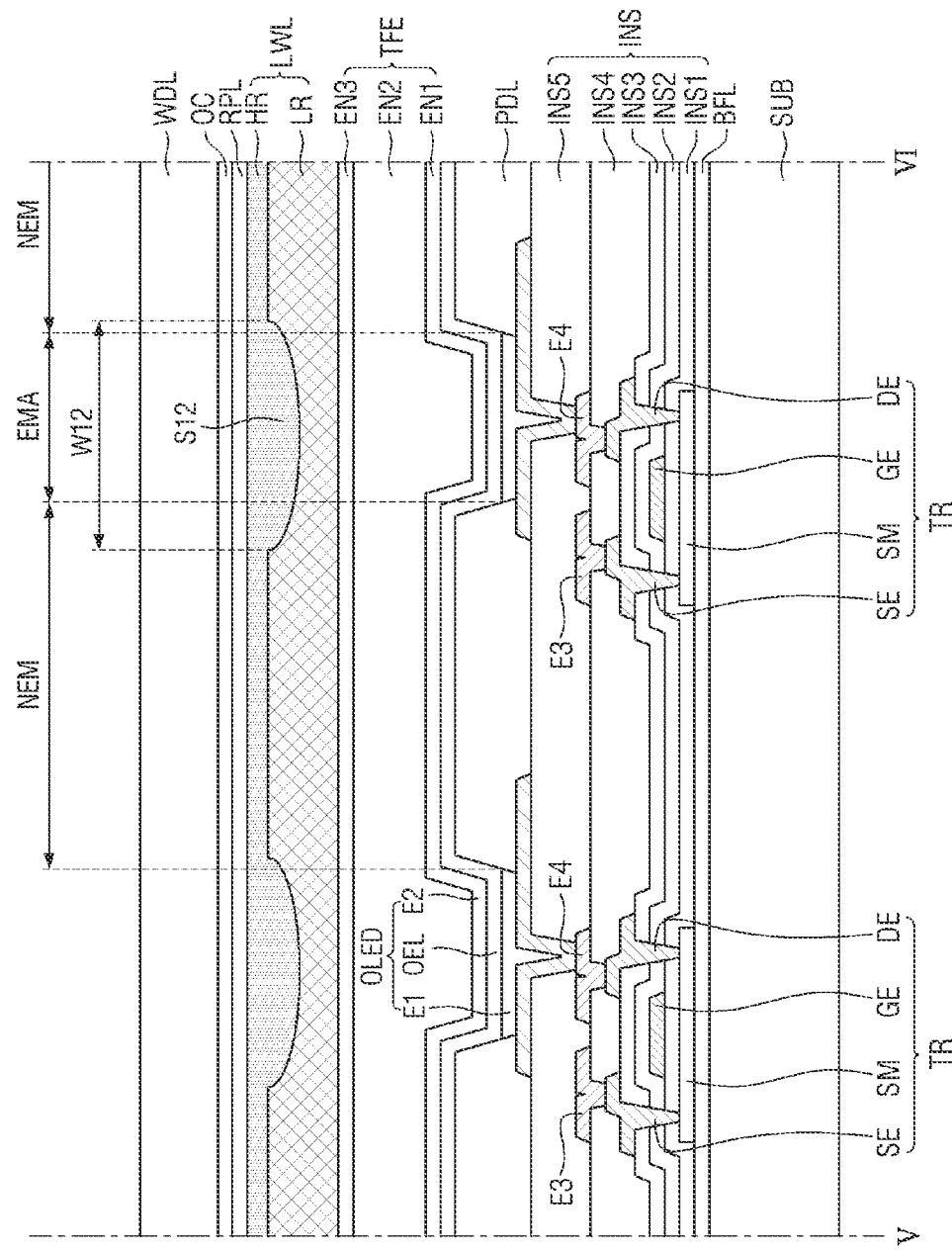
FIG. 13 is a cross-sectional view of one pixel of a display device according to an embodiment.
Figure 14:
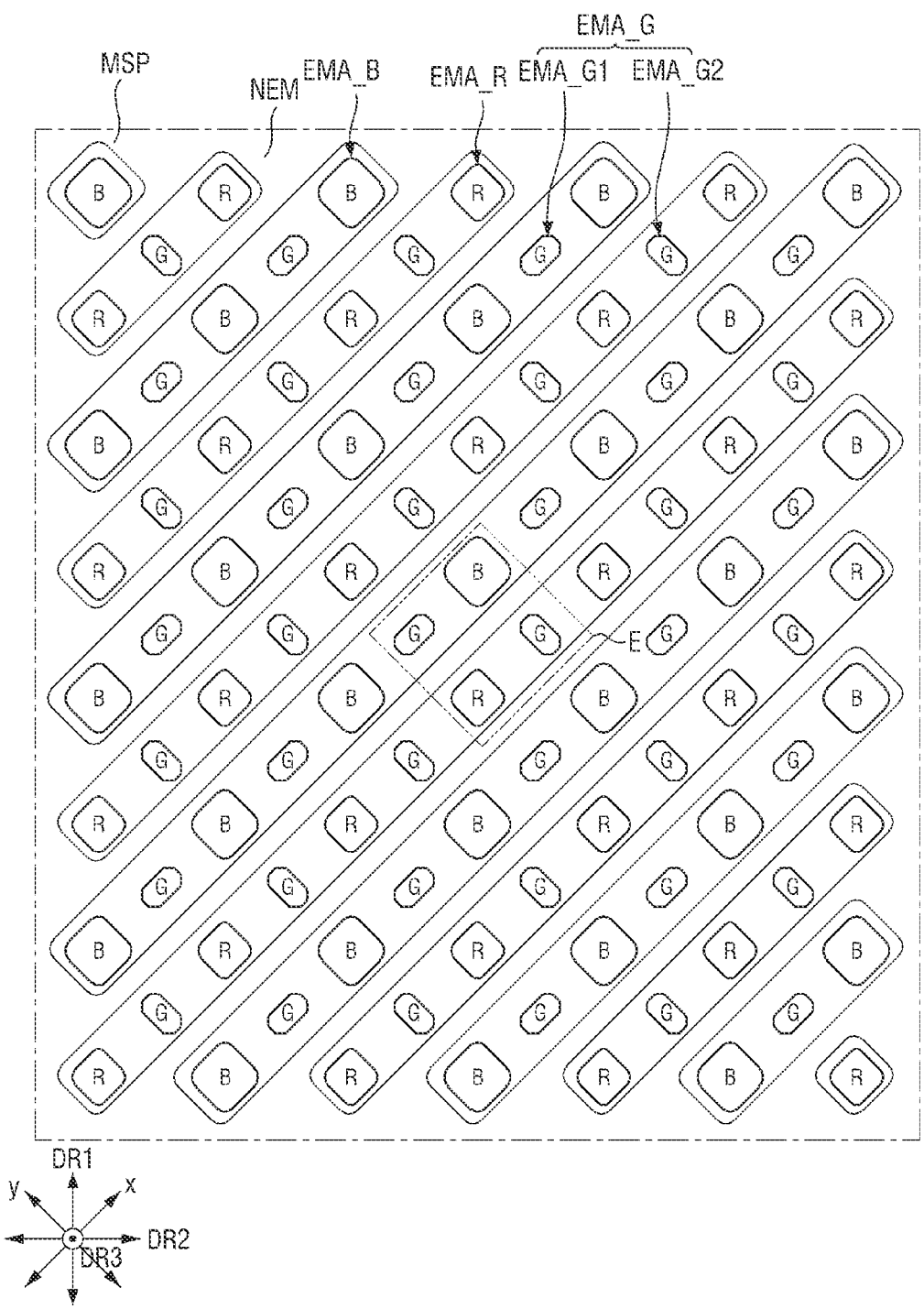
FIG. 14 is a layout view illustrating a relative arrangement relationship of pixels of a display panel according to an embodiment.
Figure 15:
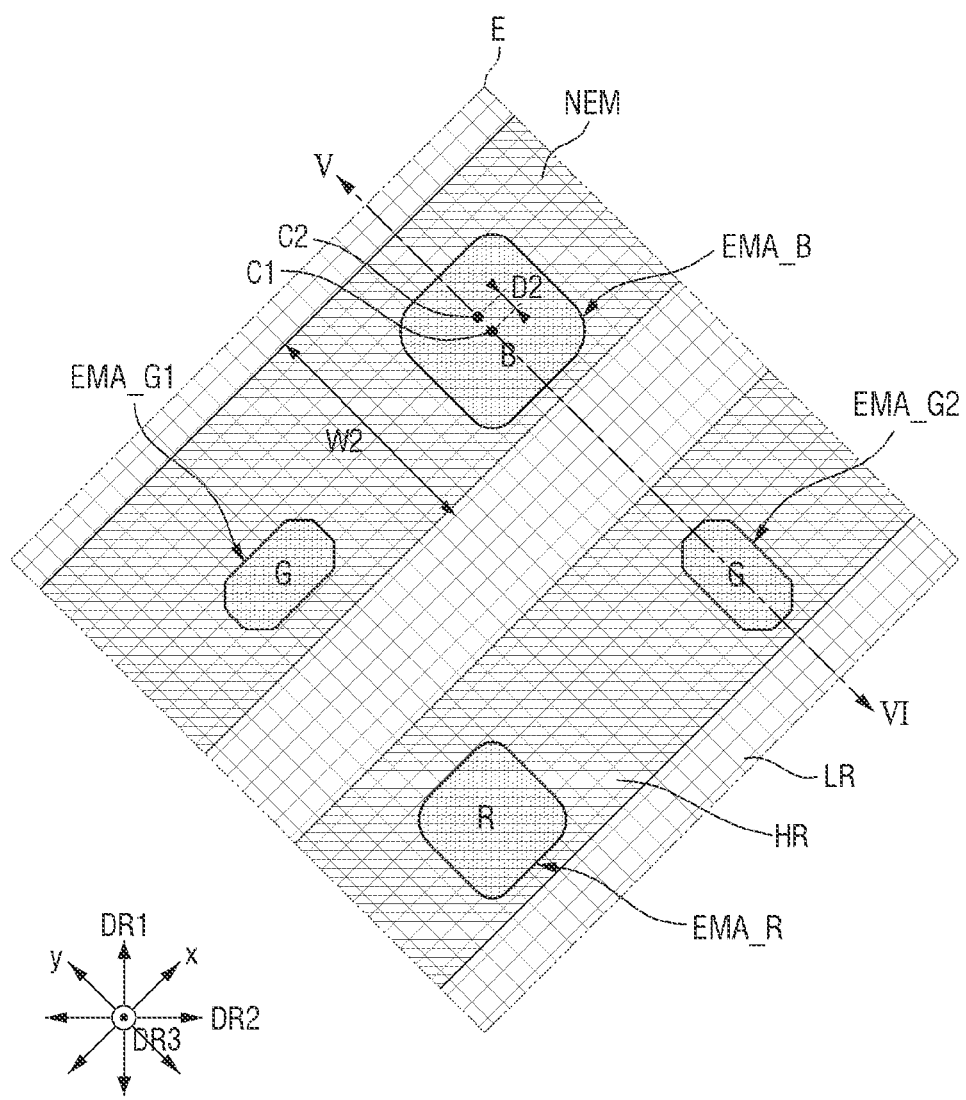
FIG. 15 is an enlarged plan layout view of area E of FIG. 14.

FIG. 13 is a cross-sectional view of one pixel of a display device according to an embodiment. FIG. 14 is a layout view illustrating a relative arrangement relationship of pixels of a display panel according to an embodiment. FIG. 15 is an enlarged plan layout view of area E of FIG. 14 according to an embodiment.

Referring to FIGS. 13 to 15, a display device according to an embodiment is different from the display device according to an embodiment of FIGS. 6 to 10 in that one high refraction pattern HR covers a plurality of emission areas.

For example, the high refraction pattern HR according to an embodiment extends in the first diagonal direction x in a plan view, and covers a plurality of pixels arranged along the first diagonal direction x. The high refraction pattern HR includes two edges positioned in a direction of a width W12. When an edge relatively distant from the first origin CC1 of the first display panel DP1, of two edges in the direction of the width W12 is defined as a first edge, and an edge close to the first origin CC1, of the two edges is defined as a second edge, an interval between each emission area EMA covered by the high refraction pattern HR and the first edge is greater than an interval between each emission area EMA and the second edge.

As described in an embodiment of FIGS. 6 to 10, when the interval between each emission area EMA covered by the high refraction pattern HR and the first edge is greater than the interval between each emission area EMA and the second edge, luminance toward a central portion increases, which may be equally applied to a plurality of emission areas EMA having the same relationship with respect to one high refractive index pattern HR, as in an embodiment of FIGS. 6 to 10.

In an embodiment, the high refraction pattern HR is not disconnected and integrally extends between edges of the emission areas EMA extending in the second diagonal direction y. Therefore, a central portion light collecting effect for the light emitted from the emission areas EMA does not occur at the corresponding positions, but the high refraction pattern HR covers pixels arranged along the first diagonal direction X so that the interval between each emission area EMA and the first edge is greater than the interval between each emission area EMA and the second edge, such that a central portion light collecting effect for the light emitted from the emission areas EMA may be obtained. Accordingly, luminance of the display device 1 may be increased.

A first interval a1 and a second interval a2 formed by the emission area EMA and the first and second edges, the width W12, angles, and curvature are substantially the same as those described above with reference to FIGS. 6 to 10, and for convenience of explanation, a further description thereof will be omitted.

Figure 16:
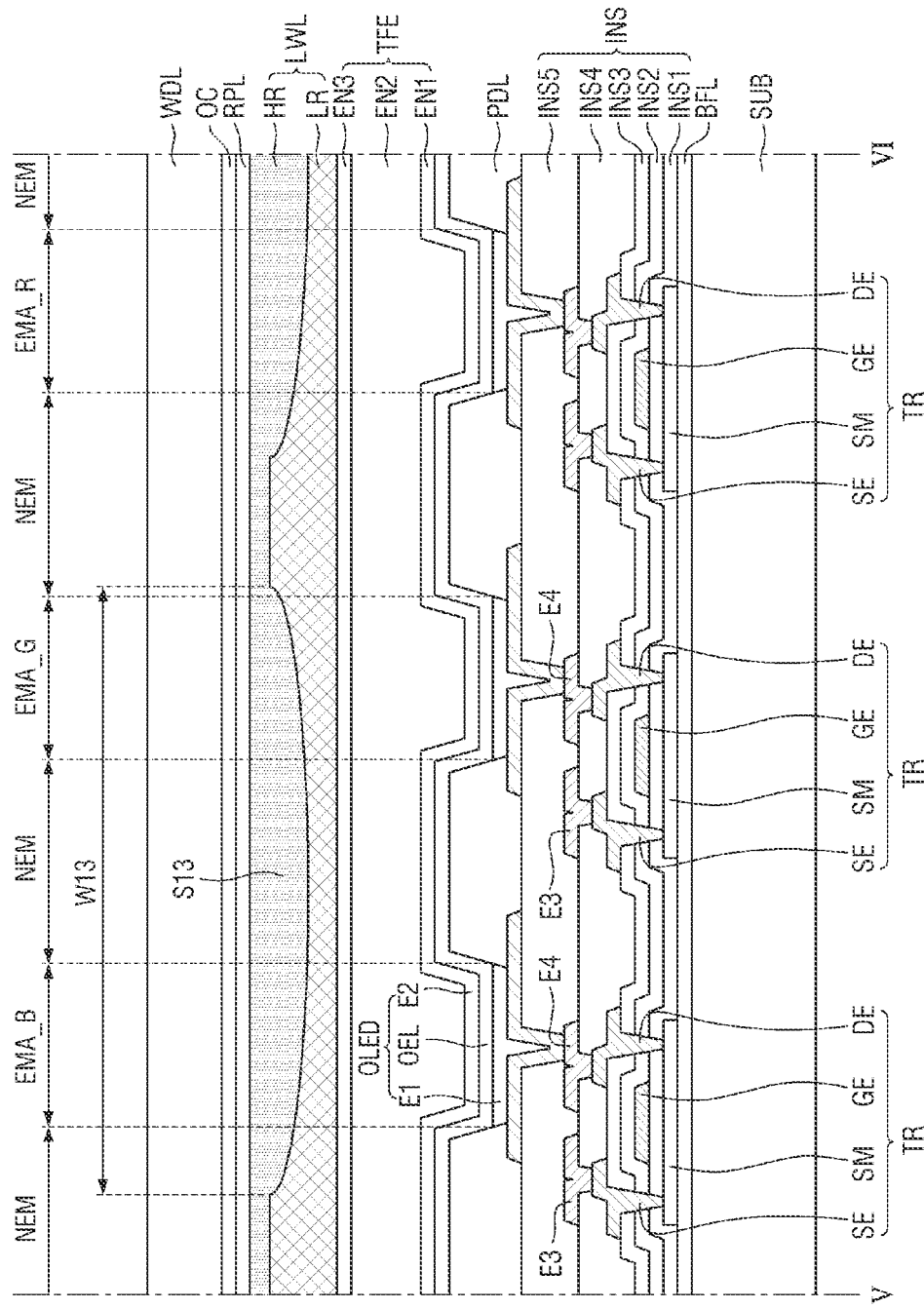
FIG. 16 is a cross-sectional view of one pixel of a display device according to an embodiment.
Figure 17:
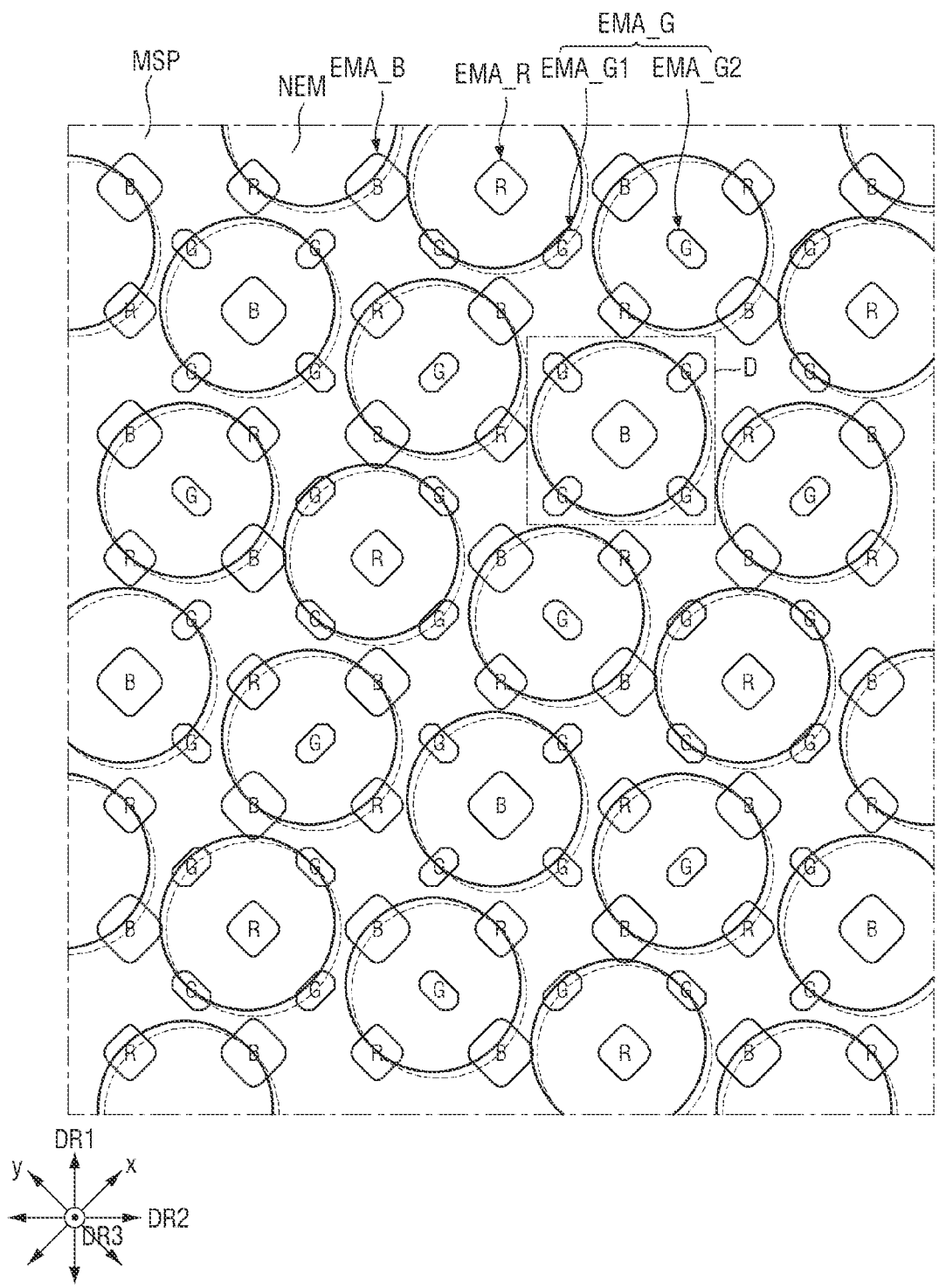
FIG. 17 is a layout view illustrating a relative arrangement relationship of pixels of a display panel according to an embodiment.
Figure 18:
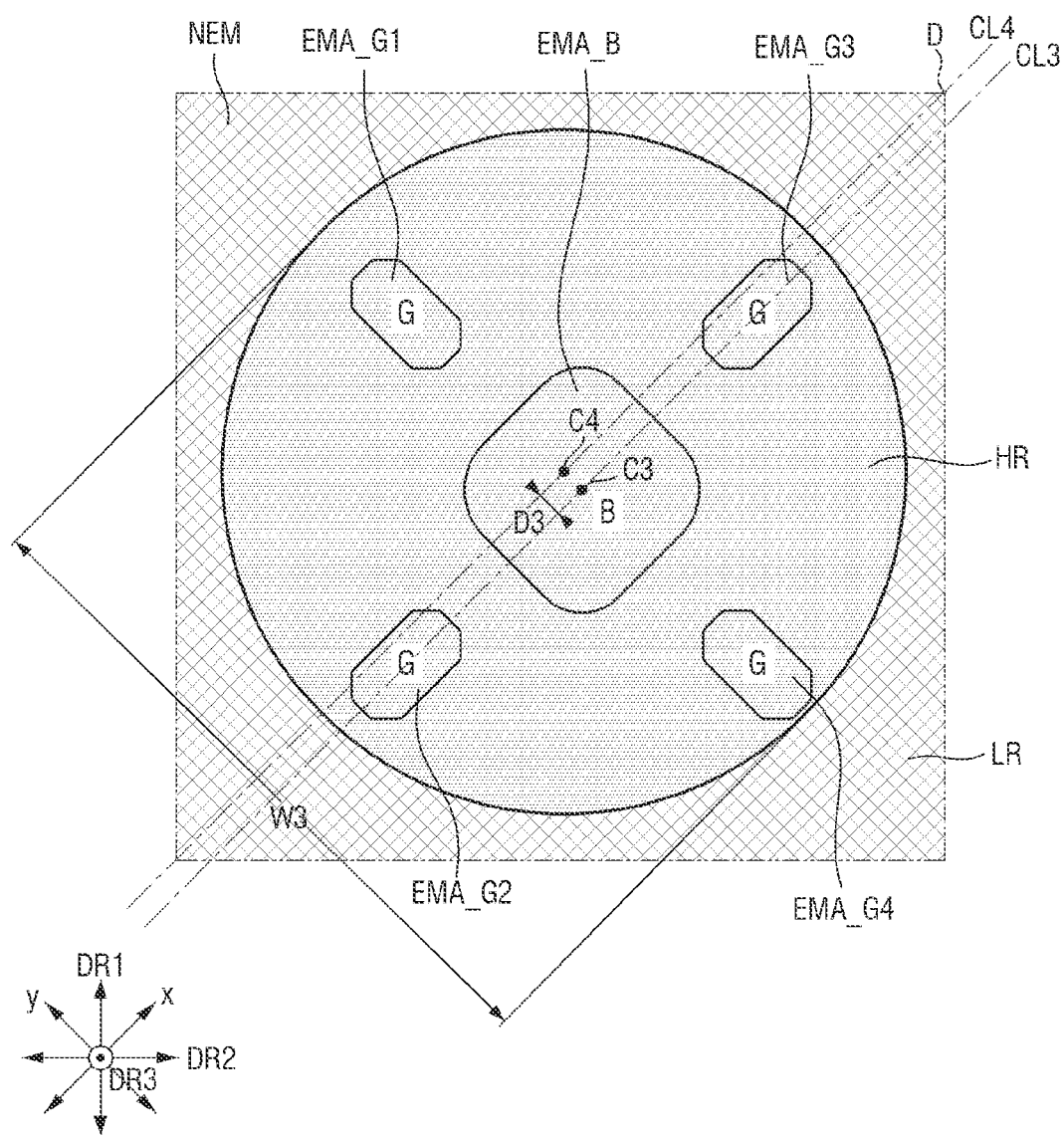
FIG. 18 is an enlarged plan layout view of area D of FIG. 16 according to an embodiment.

FIG. 16 is a cross-sectional view of one pixel of a display device according to an embodiment. FIG. 17 is a layout view illustrating a relative arrangement relationship of pixels of a display panel according to an embodiment. FIG. 18 is an enlarged plan layout view of area D of FIG. 16 according to an embodiment.

Referring to FIGS. 16 to 18, a display device according to an embodiment is different from the display device according to an embodiment of FIGS. 13 to 15 in that one high refraction pattern HR further covers a plurality of emission areas in the second diagonal direction y.

Referring to FIGS. 16 to 18, the light path changing layer LWL is disposed on the third encapsulation layer EN3. The light path changing layer LWL may include the low refraction film LR formed on the third encapsulation layer EN3 and the high refraction pattern HR formed on the low refraction film LR.

The low refraction film LR of the light path changing layer LWL is disposed on the third encapsulation layer EN3. The low refraction film LR may cover the upper surface of the emission area EMA and may be disposed over the emission area EMA and the non-emission area NEM.

The high refraction pattern HR may be disposed on the low refraction film LR. The high refraction pattern HR may be disposed on the upper surface of the emission area EMA, and may cover the upper surface of the low refraction film LR on the emission area EMA. The high refraction pattern HR may be disposed over the entire area of the emission area EMA, and may include an area greater than that of the emission area EMA in a plan view. Accordingly, the entire area of each emission area EMA may overlap the high refraction pattern HR in the thickness direction (third direction DR3), and the entire area of the organic emission layer OEL may overlap the high refraction pattern HR in the thickness direction (third direction DR3). That is, in the emission area EMA, the high refraction pattern HR may be disposed on the low refraction film LR, and the light emitted from the organic emission layer OEL may sequentially pass through the low refraction film LR and the high refraction pattern HR.

The high refraction pattern HR may have a convex shape on a surface in which the high refraction pattern HR and the low refraction film LR are in contact (e.g., direct contact) with each other. The high refraction pattern HR may have a shape of a convex lens on a surface thereof in contact with the low refraction film LR positioned in areas corresponding to a plurality of organic emission layers OEL. For example, the high refraction pattern HR may have a third convex surface S13 convex toward an opposite direction to an emission direction (hereinafter, referred to as a "fourth direction") of the light emitted from the organic emission layer OEL.

The third convex surface S13 may have a substantially circular shape or rectangular shape or rhombic shape with rounded corners in a plan view. However, embodiments are not limited thereto, and the third convex surface S13 may also have an octagonal shape, a rhombic shape, other polygonal shapes, and a polygonal shape with rounded corners, etc., as long as the third convex surface S13 covers the plurality of emission areas EMA.

A width W13 of the third convex surface S13 may be greater than a width of the emission areas EMA of the plurality of organic emission layers OEL. For example, the third convex surface S13 may have a size sufficient to cover the emission area EMA_B of the second color pixel and the emission area EMA_G of the third color pixel of the pixels including the first color pixel, the second color pixel, and the third color pixel on upper surfaces of the organic emission layers OLE. However, embodiments are not limited thereto, and the third convex surface S13 may have a size sufficient to cover at least one of the emission area EMA_R of the first color pixel, the emission area EMA_B of the second color pixel, and the emission area EMA_G of the third color pixel. The third convex surface S13 may have a radius of curvature of about 10 to about 30.

Side surfaces of the third convex surface S13 and side surfaces of the emission area EMA may be spaced apart from each other by a predetermined interval. For example, in FIG. 18, when the center of the emission area EMA_B of the second color pixel, which is the center among the plurality of organic emission layers OEL, is a third center C3, in the first area DP11, a center C4 of the third convex surface S13 and the third center C3 may be spaced apart from each other by a third distance D3 in the second diagonal direction y (upper left direction of FIG. 8). Accordingly, the third center C3 may deviate from the center C4 of the third convex surface S13. For example, the third distance D3 between the center C4 of the third convex surface S13 and the third center C3 in the second diagonal direction y may be in the range of about 2 μm to about 5 μm. However, as described above, since the third convex surface S13 may cover the upper surfaces of the plurality of emission areas EMA, the third distance D3 by which the third convex surface S13 is spaced apart from the center C3 may be within a range in which an area of the plurality of emission areas EMA overlaps the third convex surface S13 in the thickness direction.

Accordingly, in a plan view, intervals between side surfaces of the high refraction pattern HR and side surfaces of the organic emission layer OEL may be different from each other. In addition, luminance according to a viewing angle may be adjusted by adjusting the third distance D3 by which the third convex surface S13 is spaced apart from the center C3 according to, for example, the width W13, a thickness, a radius of curvature, etc., of the third convex surface S13.

In an embodiment, the low refraction film LR is stacked on the high refraction pattern HR, and thus, the high refraction pattern HR may include a third convex surface S13. The third convex surface S13 covers the plurality of emission areas EMA of the pixels. The third convex surface S13 may also collect and refract light spreading in the front surface direction and all directions within a specific angle. In the case of the display device including the multi-channel lens, each area of the first display panel DP1 utilizes a viewing angle of about 10° to about 50°. The third convex surface S13 may be spaced apart from the center C3 by the third distance D3, and may refract the light emitted from the organic emission layer OEL at a side viewing angle of about 10° to about 50°.

Accordingly, the luminance of the light source may be secured at a predetermined side viewing angle of the display device 1 through the third convex surface S13 of the light path changing layer LWL.

Figure 19:
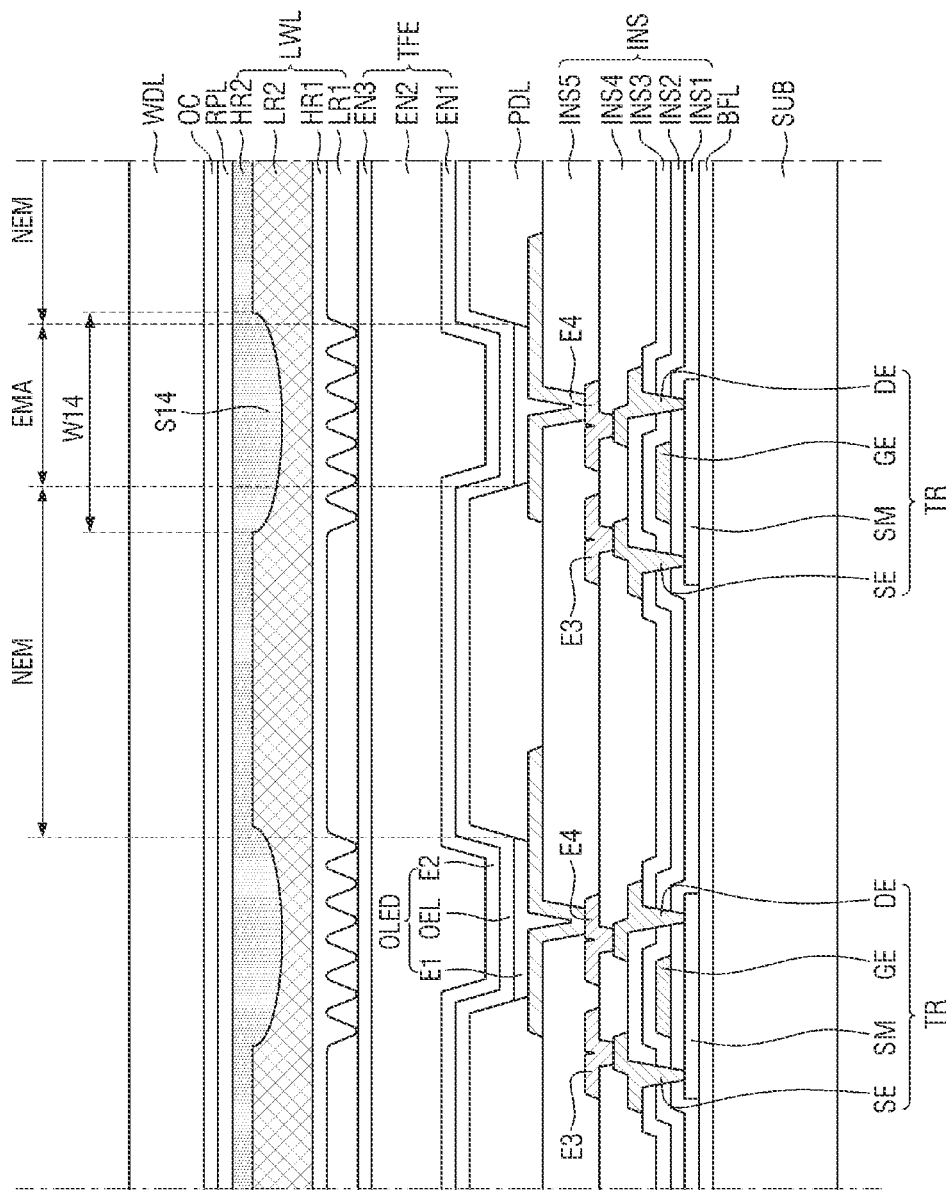
FIGS. 19 and 20 are cross-sectional views of one pixel according to an embodiment.
Figure 20:
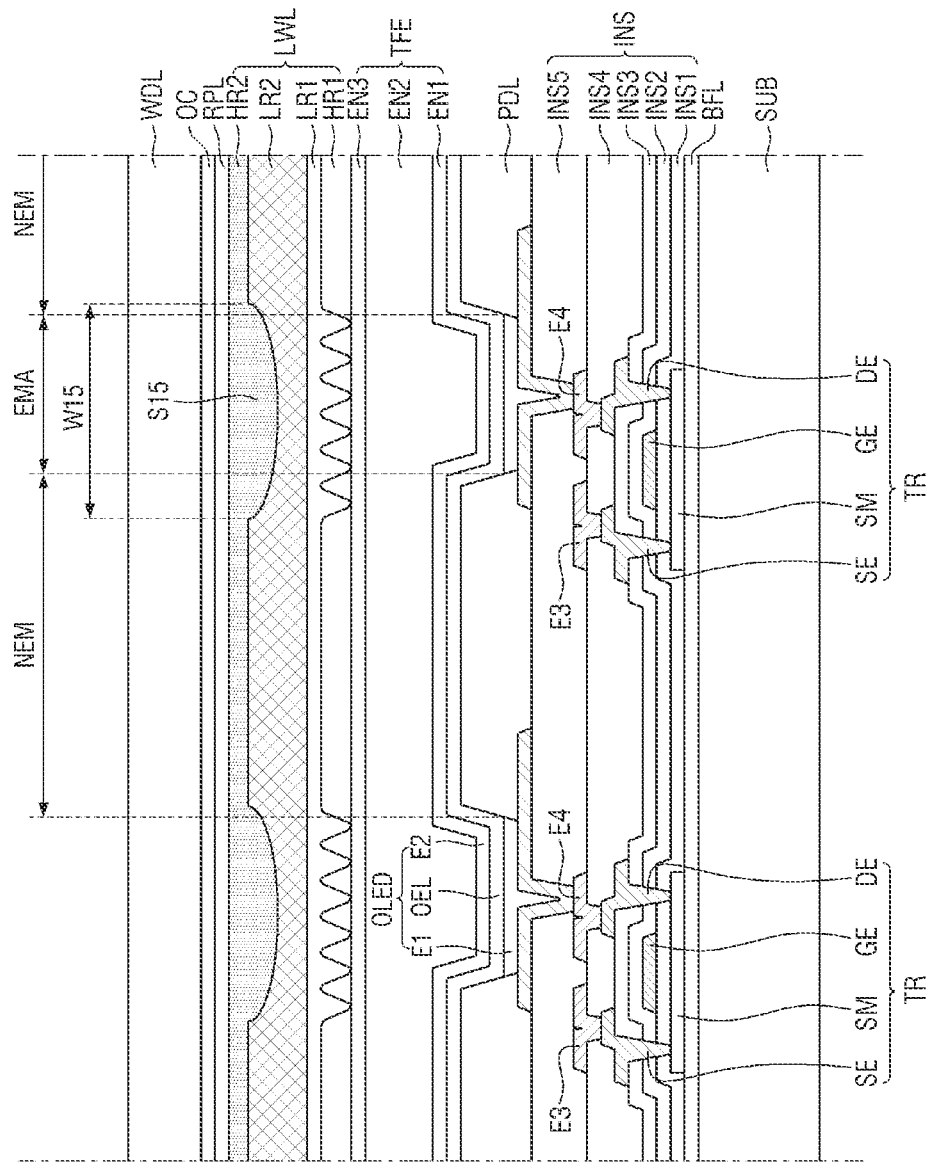
Figure 21:
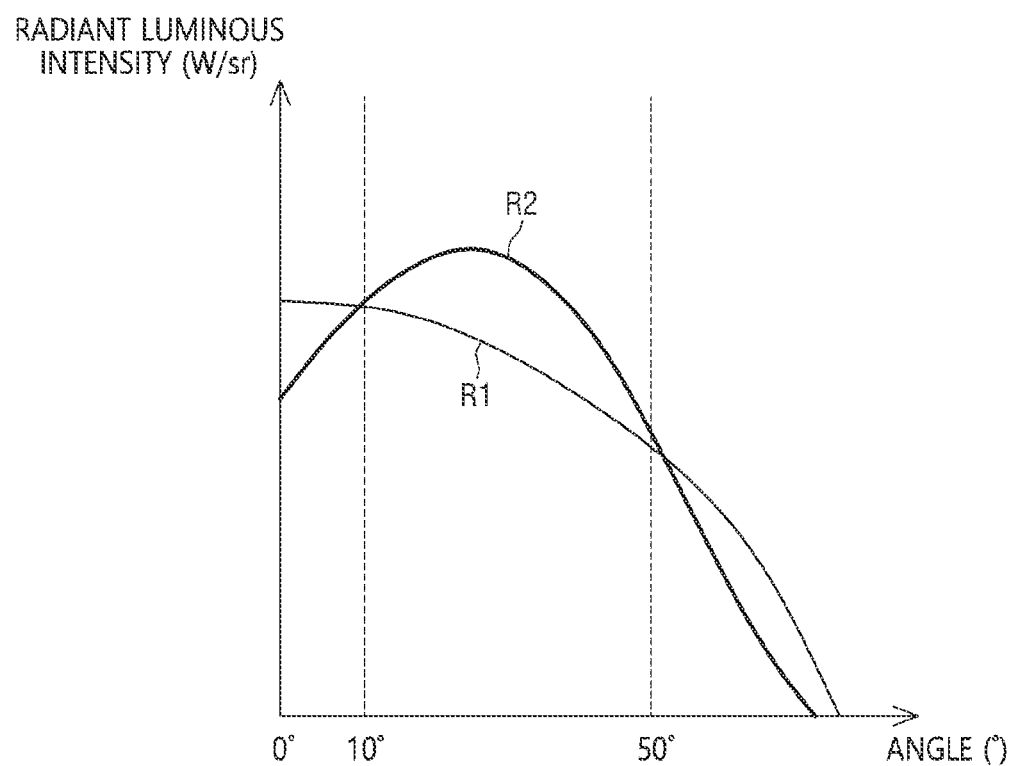
FIG. 21 is a graph illustrating luminance according to a viewing angle of an organic light emitting element according to an embodiment.

FIGS. 19 and 20 are cross-sectional views of one pixel according to an embodiment. FIG. 21 is a graph illustrating luminance according to a viewing angle of an organic light emitting element according to an embodiment.

Referring to FIGS. 19 and 20, a display device according to an embodiment is different from the display device according to an embodiment of FIGS. 7 to 10 in that the light path changing layer LWL further includes a first low refraction film LR1 and a first high refraction pattern HR1, in addition to a second low refraction film LR2 and a second first high refraction pattern HR2, which is formed on the second low refraction film LR2, each corresponding to the low refraction film LR and the high refraction pattern HR in FIGS. 7 to 10.

For example, the light path changing layer LWL is disposed on the third encapsulation layer EN3. The light path changing layer LWL may include the first low refraction film LR1 disposed on the third encapsulation layer EN3 and the first high refraction pattern HR1 formed on the first low refraction film LR1.

The first low refraction film LR1 is disposed on the third encapsulation layer EN3. The first low refraction film LR1 may cover the upper surface of the emission area EMA and may be disposed over the emission area EMA and the non-emission area NEM.

The first high refraction pattern HR1 is disposed on the first low refraction film LR1. The first high refraction pattern HR1 may cover the upper surface of the emission area EMA and may be disposed over the emission area EMA and the non-emission area NEM. In the emission area EMA, the first high refraction pattern HR1 may be disposed on the first low refraction film LR1, and the light emitted from the organic emission layer OEL may sequentially pass through the first low refraction film LR and the first high refraction pattern HR1.

Alternatively, in the emission area EMA, the first low refraction film LR1 may be disposed on the first high refraction pattern HR1, and the light emitted from the organic emission layer OEL may sequentially pass through the first high refraction pattern HR1 and the first low refraction film LR.

The first high refraction pattern HR1 and the first low refraction film LR1 may have a convex shape on a contact surface therebetween in the emission area EMA. The first high refraction pattern HR1 may have a shape of a plurality of convex lenses on a surface thereof in contact with the first low refraction film LR1 positioned in an area corresponding to each organic emission layer OEL. For example, the first high refraction pattern HR1 may have a shape of a plurality of convex lenses toward an opposite direction to an emission direction (fourth direction) of the light emitted from the organic emission layer OEL.

The first low refraction film LR1 may have substantially the same refractive index as the second low refraction film LR2, and the first high refraction pattern HR1 may have substantially the same refractive index as the second high refraction pattern HR2.

The first low refraction film LR1 and the first high refraction pattern HR1 may refract light spreading in the front surface direction and all directions by sequentially passing through the first low refraction film LR1 and/or the first high refraction pattern HR1 and sequentially passing through the second low refraction film LR2 and a fourth convex surface S14 of the second high refraction pattern HR2.

The second low refraction film LR2 is disposed on the first high refraction pattern HR1, and the second high refraction pattern HR2 is disposed on the second low refraction film LR2. The second high refraction pattern HR2 may have the fourth convex surface S14 convex toward an emission direction (fourth direction) of the light emitted from the organic emission layer OEL.

A width W14, a thickness, a radius of curvature, and a spaced distance of the fourth convex surface S14 is substantially the same as those of FIGS. 7 to 13, and for convenience of explanation, a further description thereof will be omitted.

In an embodiment, referring to FIG. 19, the second high refraction pattern HR2 is stacked on the second low refraction film LR2, and may thus include the fourth convex surface S14. Accordingly, the light spreading in the front surface direction and all directions may be collected and refracted within a specific angle through the fourth convex surface S14. In the case of the display device including the multi-channel lens, the fourth convex surface S14 may be spaced apart from the center of the organic emission layer OLE by a predetermined distance, and may refract the light emitted from the organic emission layer OEL at a side viewing angle of about 10° to about 50°. Accordingly, the luminance of the light source may be secured at a predetermined side viewing angle of the display device 1 through the fourth convex surface S14 of the light path changing layer LWL.

In an embodiment, the light path changing layer LWL may further include the first low refraction film LR1 and a first high refraction pattern HR1 formed on the first low refraction film LR1 to further refract the light spreading in the front surface direction and all directions by sequentially passing through the first low refraction film LR1 and/or the first high refraction pattern HR1 and sequentially passing through the second low refraction film LR2 and the fourth convex surface S14 of the second high refraction pattern HR2 in the front surface direction. Accordingly, the luminance of the light source may be further secured at a predetermined side viewing angle of the display device 1.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display device, comprising:
a substrate comprising a plurality of pixels arranged along a first direction and a second direction;
a pixel defining film disposed on the substrate, disposed along a boundary of a pixel among the plurality of pixels, and defining an emission area;
an emission layer disposed in the emission area defined by the pixel defining film;

a first refraction film disposed on the pixel defining film and the emission layer and having a first refractive index; and a second refraction film covering the first refraction film and having a second refractive index different from the first refractive index, wherein the second refraction film comprises a reference surface and a convex surface convexly protruding from the reference surface, the convex surface overlapping the emission area, each of the emission area and the convex surface comprises a first edge and a second edge extending in a first diagonal direction crossing the first direction and the second direction, the first edge and the second edge of the convex surface are positioned outside the first edge and the second edge of the emission area, respectively, a first interval between the first edge of the convex surface and the first edge of the emission area is greater than a second interval between the second edge of the convex surface and the second edge of the emission area, and a center of the convex surface is not aligned with a center of the emission layer.

2. The display device of claim 1,
wherein the first refraction film and the second refraction film contact each other, and have complementary shapes in a contact surface therebetween.

3. The display device of claim 2,
wherein the convex surface has an island shape in a plan view.

4. The display device of claim 1,
wherein the first interval is greater than the second interval by about ⅕ to about ½ of a width of the convex surface in the first diagonal direction.

5. The display device of claim 1,
wherein a thickness of the convex surface from the reference surface is within a range of about ⅛ to about ⅙ of a width of the convex surface in the first diagonal direction.

6. The display device of claim 1,
wherein each of the emission area and the convex surface further comprises a third edge and a fourth edge extending in a second diagonal direction crossing the first direction, the second direction, and the first diagonal direction, the third edge and the fourth edge of the convex surface are positioned outside the third edge and the fourth edge of the emission area, respectively, and a third interval between the third edge of the convex surface and the third edge of the emission area is the same as a fourth interval between the fourth edge of the convex surface and the fourth edge of the emission area.

7. The display device of claim 6,
wherein the third interval and the fourth interval are smaller than the first interval by about 1/10 to about ¼ of a width of the convex surface in the first diagonal direction.

8. The display device of claim 1,
wherein the second refractive index is greater than the first refractive index.

9. The display device of claim 8,
wherein the convex surface convexly protrudes from the reference surface toward the first refraction film.

10. The display device of claim 9,
wherein the second refractive index is in a range of about 1.73 to about 1.8, and the first refractive index is in a range of about 1.46 to about 1.48.

11. The display device of claim 1,
wherein the convex surface convexly protrudes from the reference surface in an opposite direction to the first refraction film, and the second refractive index is smaller than the first refractive index.

12. The display device of claim 1,
wherein the convex surface extends in a second diagonal direction, and overlaps the emission area of each of the plurality of pixels arranged along the second diagonal direction.

13. The display device of claim 12,
wherein the convex surface further extends in the first diagonal direction, and the emission area of each of the plurality of pixels is further arranged along the first diagonal direction.

14. The display device of claim 1, further comprising:
a third refraction film disposed between the pixel defining film and the emission layer and having a third refractive index; and a fourth refraction film disposed on the third refraction film and having a fourth refractive index different from the third refractive index.

15. The display device of claim 14,
wherein the fourth refraction film comprises at least one protrusion part disposed in a thickness direction so as to overlap the emission area.

16. The display device of claim 14,
wherein the fourth refractive index is greater than the third refractive index.

17. The display device of claim 14,
wherein each of the emission area and the convex surface further comprises a third edge and a fourth edge extending in a second diagonal direction crossing the first direction, the second direction, and the first diagonal direction, the third edge and the fourth edge of the convex surface are positioned outside the third edge and the fourth edge of the emission area, respectively, and a third interval between the third edge of the convex surface and the third edge of the emission area is the same as a fourth interval between the fourth edge of the convex surface and the fourth edge of the emission area.

18. A display device, comprising:
a substrate comprising a plurality of pixels arranged along a first direction and a second direction;

a pixel defining film disposed on the substrate, disposed along a boundary of a pixel among the plurality of pixels, and defining an emission area;

an emission layer disposed in the emission area defined by the pixel defining film;

a first refraction film disposed on the pixel defining film and the emission layer; and a second refraction film covering the first refraction film, wherein the second refraction film comprises a reference surface and a convex surface convexly protruding from the reference surface, the convex surface overlapping the emission area, the substrate comprises a first area positioned on a first side of a first virtual line in the first direction and a second area positioned on a second side of the first virtual line in the first direction, the first virtual line extending in the second direction and passing through one point of the substrate, in the first area, each of the emission area and the convex surface comprises a first edge and a second edge extending in a first diagonal direction crossing the first direction and the second direction, the first edge and the second edge of the convex surface are positioned outside the first edge and the second edge of the emission area, respectively, and a first interval between the first edge of the convex surface and the first edge of the emission area is greater than a second interval between the second edge of the convex surface and the second edge of the emission area, and in the second area, each of the emission area and the convex surface comprises a third edge and a fourth edge extending in a second diagonal direction crossing the first direction, the second direction, and the first diagonal direction, the third edge and the fourth edge of the convex surface are positioned outside the third edge and the fourth edge of the emission area, respectively, and a third interval between the third edge of the convex surface and the third edge of the emission area is greater than a fourth interval between the fourth edge of the convex surface and the fourth edge of the emission area, and a center of the convex surface is not aligned with a center of the emission layer.

19. The display device of claim 18, wherein the first area and the second area are positioned on a first side of a second virtual line in the second direction, the second virtual line extending in the first direction and passing through one point of the substrate, and the substrate further comprises a third area positioned on a second side of the second virtual line in the second direction and positioned on a first side of the first virtual line in the first direction and a fourth area positioned on a second side of the second virtual line in the second direction and positioned on the second side of the first virtual line in the first direction, in the third area, each of the emission area and the convex surface comprises a third edge and a fourth edge extending in the second diagonal direction, the third edge and the fourth edge of the convex surface are positioned outside the third edge and the fourth edge of the emission area, respectively, and a third interval between the third edge of the convex surface and the third edge of the emission area is greater than a fourth interval between the fourth edge of the convex surface and the fourth edge of the emission area, and in the fourth area, each of the emission area and the convex surface comprises a first edge and a second edge extending in the second diagonal direction crossing the first direction, the second direction, and the first diagonal direction, the first edge and the second edge of the convex surface are positioned outside the first edge and the second edge of the emission area, respectively, and a first interval between the first edge of the convex surface and the first edge of the emission area is greater than a second interval between the second edge of the convex surface and the second edge of the emission area.

20. An electronic device, comprising:

a substrate comprising a plurality of pixels arranged along a first direction and a second direction;

a pixel defining film disposed on the substrate, disposed along a boundary of a pixel among the plurality of pixels, and defining an emission area;

an emission layer disposed in the emission area defined by the pixel defining film;

a first refraction film disposed on the pixel defining film and the emission layer and having a first refractive index; and a second refraction film covering the first refraction film and having a second refractive index different from the first refractive index, wherein the second refraction film comprises a reference surface and a convex surface convexly protruding from the reference surface, the convex surface overlapping the emission area, each of the emission area and the convex surface comprises a first edge and a second edge extending in a first diagonal direction crossing the first direction and the second direction, the first edge and the second edge of the convex surface are positioned outside the first edge and the second edge of the emission area, respectively, a first interval between the first edge of the convex surface and the first edge of the emission area is greater than a second interval between the second edge of the convex surface and the second edge of the emission area, and a center of the convex surface is not aligned with a center of the emission layer.

* * * * *